(12) United States Patent
Brunker et al.

(10) Patent No.: US 6,976,881 B2
(45) Date of Patent: Dec. 20, 2005

(54) GROUPED ELEMENT TRANSMISSION CHANNEL LINK TERMINATION ASSEMBLIES

(75) Inventors: David L. Brunker, Naperville, IL (US); Daniel L. Dawiedczyk, Naperville, IL (US); John E. Lopata, Naperville, IL (US); Arindum Dutta, Warrenville, IL (US)

(73) Assignee: Molex Incorporated, Lisle, IL (US)

( * ) Notice: Subject to any disclaimer, the term of this patent is extended or adjusted under 35 U.S.C. 154(b) by 71 days.

(21) Appl. No.: 11/001,445

(22) Filed: Nov. 30, 2004

(65) Prior Publication Data

US 2005/0092513 A1 May 5, 2005

Related U.S. Application Data

(62) Division of application No. 10/331,712, filed on Dec. 30, 2002, now Pat. No. 6,840,810.

(60) Provisional application No. 60/344,223, filed on Dec. 28, 2001, provisional application No. 60/354,581, filed on Feb. 5, 2002.

(51) Int. Cl.[7] .............................................. H01R 23/70
(52) U.S. Cl. ..................................................... 439/637
(58) Field of Search ................................ 439/637, 577, 439/493, 660, 82, 931, 76.1, 620, 79, 78

(56) References Cited

U.S. PATENT DOCUMENTS

| | | | |
|---|---|---|---|
| 3,659,916 A | 5/1972 | Marcatill | |
| 3,918,120 A * | 11/1975 | Yoshikawa | 16/108 |
| 4,188,715 A * | 2/1980 | Ammon et al. | 29/884 |
| 4,382,236 A | 5/1983 | Suzuki | |
| 4,707,671 A | 11/1987 | Suzuki et al. | |
| 4,726,790 A * | 2/1988 | Hadjis | 439/620 |
| 4,891,616 A | 1/1990 | Renken et al. | |

(Continued)

FOREIGN PATENT DOCUMENTS

DE 19503666 C2 9/1955

(Continued)

OTHER PUBLICATIONS

International Search Report for International Application No. PCT/US02/41793 completed on Apr. 24, 2003.

(Continued)

Primary Examiner—Ross Gushi
Assistant Examiner—Phuongchi Nguyen
(74) Attorney, Agent, or Firm—Thomas D. Paulius

(57) ABSTRACT

Termination assemblies for terminating high-frequency data signal transmission lines include housings with one or more cavities that receive ends of the transmission line therein. The transmission line typically includes a dielectric body and a plurality of conductive elements disposed thereon, with the plurality of conductive elements being arranged in pairs for differential signal transmission. The termination assemblies, in one embodiment include hollow end caps that are formed from a dielectric and which have one or more conductive contacts or plated surfaces disposed on or within the cavity so that they will frictionally mate with the conductive traces on the transmission line. In another embodiment, a connector housing is provided with a center slot and a plurality of dual loop contacts to provide redundant circuit paths and low inductance to the termination assembly. A coupling element may be utilized in the slot to achieve a desired level of coupling between the termination contacts.

10 Claims, 18 Drawing Sheets

U.S. PATENT DOCUMENTS

| | | | |
|---|---|---|---|
| 5,015,519 A | | 5/1991 | Yumoto |
| 5,069,626 A | | 12/1991 | Patterson et al. |
| 5,114,364 A | | 5/1992 | Hunter |
| 5,133,669 A | * | 7/1992 | Barnhouse et al. ........... 439/78 |
| 5,149,915 A | | 9/1992 | Brunker et al. |
| 5,192,228 A | | 3/1993 | Collins et al. |
| 5,599,208 A | * | 2/1997 | Ward .......................... 439/620 |
| 5,626,483 A | | 5/1997 | Naitoh |
| 6,102,744 A | * | 8/2000 | Korsunsky et al. ......... 439/637 |
| 6,185,354 B1 | * | 2/2001 | Kronz et al. ................ 385/129 |
| 6,200,146 B1 | * | 3/2001 | Sarkissian .................... 439/79 |
| 6,210,181 B1 | * | 4/2001 | Tomita ....................... 439/892 |
| 2003/0179050 A1 | | 9/2003 | Brunker et al. |
| 2004/0113711 A1 | | 6/2004 | Brunker et al. |

FOREIGN PATENT DOCUMENTS

| | | |
|---|---|---|
| GB | 655803 | 8/1951 |
| GB | 2217114 A | 10/1989 |
| JP | 1106602 | 4/1989 |
| JP | 01106602 | 4/1989 |
| JP | 2000114821 | 4/2000 |
| WO | WO 01/76015 A1 | 10/2001 |

OTHER PUBLICATIONS

"Numerical and Experimental Modeling of High-Speed Cables and Interconnects", Beker, Benjamin and Hirsch, Tom, 1997 Electronic Components and Technology Conference.

* cited by examiner

GROUPED ELEMENT TRANSMISSION CHANNEL LINK TERMINATION ASSEMBLIES

REFERENCE TO RELATED APPLICATIONS

This is a division of application Ser. No. 10/331,712, filed Dec. 30, 2002, now U.S. Pat. No. 6,840,810, which claims priority of prior U.S. provisional patent applications No. 60/344,223 filed Dec. 28, 2001 and No. 60/354,581, filed Feb. 5, 2002.

BACKGROUND OF THE INVENTION

The present invention pertains to multi-circuit electronic communication systems, and more particularly, to a dedicated transmission channel structure for use in such systems.

Various means of electronic transmission are known in the art. Most, if not all of these transmission means, suffer from inherent speed limitations such as both the upper frequency limit and the actual time a signal requires to move from one point to another within the system, which is commonly referred to as propagation delay. They simply are limited in their electronic performance primarily by their structure, and secondarily by their material composition. One traditional approach utilizes conductive pins, such as those found in an edge card connector as is illustrated in FIG. 1. In this type of structure a plurality of conductive pins, or terminals 20, are arranged within a plastic housing 21 and this arrangement provides operational speeds of about 800 to 900 MHz. An improvement upon this standard structure is represented by edge card connectors that may be known in the art as "Hi-Spec" and which are illustrated in FIG. 2, in which the system includes large ground contacts 25 and small signal contacts 26 disposed within an insulative connector housing 27. The smaller signal contacts 26 couple to the larger ground contacts 25. The signal contacts in these structures are not differential signal contacts, but are merely single-ended signal, meaning that every signal contact is flanked by a ground contact. The operational speeds for this type of system are believed to be about 2.3 Ghz.

Yet another improvement in this field is referred to as a "triad" or "triple" connector in which conductive terminals are disposed within a plastic housing 28 in a triangular pattern, and the terminals include a large ground terminal 29, and two smaller differential signal terminals 30, as illustrated in FIG. 3, and, as described in greater detail U.S. Pat. No. 6,280,209. This triad/triple structure has an apparent upper limit speed of about 4 Ghz. All three of these approaches utilize, in the most simplest sense, conductive pins in a plastic housing in order to provide a transmission line for electronic signals.

In each of these type constructions, it is desired to maintain a dedicated transmission line through the entire delivery path of the system, including through the circuit board(s), the mating interface and the source and load of the system. It is difficult to achieve the desired uniformity within the system when the transmission system is constructed from individual pins. Discrete point-to-point connections are used in these connectors for signal, ground and power. Each of these conductors was designed as either a conductor or a means of providing electrical continuity and usually did not take into account transmission line effects. Most of the conductors were designed as a standard pinfield so that all the pins, or terminals, were identical, regardless of their designated electrical function and the pins were further arranged at a standard pitch, material type and length. Although satisfactory in performance at low operating speeds, at high operational speeds, these systems would consider the conductors as discontinuities in the system that affect the operation and speed thereof.

Many signal terminals or pins in these systems were commoned to the same ground return conductor, and thus created a high signal to ground ratio, which did not lend themselves to high-speed signal transmission because large current loops are forced between the signals and the ground, which current loops reduce the bandwidth and increase the crosstalk of the system, thereby possibly degrading the system performance.

Bandwidth ("BW") is proportional to $1/\sqrt{LC}$, where L is the inductance of the system components, C is the capacitance of the system components and BW is the bandwidth. The inductive and capacitive components of the signal delivery system work to reduce the bandwidth of the system, even in totally homogeneous systems without discontinuities. These inductive and capacitive components can be minimized by reducing the overall path length through the system, primarily through limiting the area of the current path through the system and reducing the total plate area of the system elements. However, as the transmission frequency increases, the reduction in size creates its own problem in that the effective physical length is reduced to rather small sizes. High frequencies in the 10 Ghz range and above render most of the calculated system path lengths unacceptable.

In addition to aggregate inductance and capacitance across the system being limiting performance factors, any non-homogeneous geometrical and/or material transitions create discontinuities. Using about 3.5 Ghz as a minimum cutoff frequency in a low voltage differential signal system operating at around 12.5 Gigabits per second (Gbps), the use of a dielectric with a dielectric constant of about 3.8 will yield a critical path length of about 0.25 inches, over which length discontinuities may be tolerated. This dimension renders impracticable the ability of one to construct a system that includes a source, transmission load and load within the given quarter-inch. It can thus be seen that the evolution of electronic transmission structures have progressed from uniform-structured pin arrangements to functionally dedicated pins arrangements to attempted unitary structured interfaces, yet the path length and other factors still limit these structures. With the aforementioned prior art structures, it was not feasible to carry high frequency signals due to the physical restraints of these systems and the short critical path lengths needed for such transmission.

In order to obtain an effective structure, one must maintain a constant and dedicated transmission line over the entire delivery path: from the source, through the interface and to the load. This would include the matable interconnects and printed circuit boards. This is very difficult to achieve when the delivery system is constructed from individual, conductive pins designed to interconnect with other individual conductive pins because of potential required changes in the size, shape and position of the pins/terminals with respect to each other. For example, in a right angle connector, the relationship between the rows of pins/terminals change in both the length and the electrical coupling. High speed interconnect design principles that include all areas between the source and load of the system including printed circuit boards, board connectors and cable assemblies are being used in transmission systems with sources of up to 2.5 Gbps. One such principle is the principle of ground by design which provides added performance over a standard pin field in that coupling is enhanced between the signal and ground paths and single-ended operation is complimented. Another principle being used in such systems includes impedance tuning to minimize discontinuities. Yet another design principle is pinout optimization where signal and return paths are assigned to specific pins in the pin field to maximize the performance. These type of systems all are limited with respect to attaining the critical path lengths mentioned above.

The present invention is directed to an improved transmission or delivery system that overcomes the aforementioned disadvantages and which operates at higher speeds.

SUMMARY OF THE INVENTION

The present directed is therefore directed to an improved transmission structure that overcomes the aforementioned disadvantages and utilizes grouped electrically conductive elements to form a unitary mechanical structure that provides a complete electronic transmission channel that is similar in one sense to a fiber optic system. The focus of the invention is on providing a complete, copper-based electronic transmission channel rather than utilizing either individual conductive pins or separable interfaces with copper conductors as the transmission cahnnel, the transmission channels of the invention yielding more predictable electrical performance and greater control of operational characteristics. Such improved systems of the present invention are believed to offer operating speeds for digital signal transmission of up to at least 12.5 GHz at extended path lengths which are much greater than 0.25 inch.

Accordingly, it is a general object of the present invention to provide an engineered waveguide that functions as a grouped element channel link, where the link includes an elongated dielectric body portion and at least two conductive elements disposed along the exterior surface thereof.

Another object of the present invention is to provide a high-speed channel link (or transmission line) having an elongated body portion of a given cross-section, the body portion being formed from a dielectric with a selected dielectric constant, and the link having, in its most basic structure, two conductive elements disposed on the exterior surface thereof, the elements being of similar size and shape and oriented thereon, in opposition to each other, so as to steer the electrical energy wave traveling through the link by establishing particular electrical and magnetic fields between the two conductive elements and maintaining these fields throughout the length of the channel link.

A further object of the present invention is to control the impedance of the channel link by selectively sizing the conductive elements and the gaps therebetween on the exterior surface of the elongated body to maintain balanced or unbalanced electrical & magnetic fields.

Yet another object of the present invention is to provide a improved electrical transmission channel that includes a flat substrate, and a plurality of grooves formed in the substrate, the grooves having opposing sidewalls and the grooves being spaced apart by intervening lands of the substrate, the sidewalls of the grooves having a conductive material deposited thereon, such as by plating or deposition, to form electronic transmission channels within the grooves.

A still further object of the present invention is to provide a pre-engineered wave guide in which at least a pair of conductive elements are utilized to provide differential signal transmission, i.e., signal in ("+") and signal out ("−"), the pair of conductive elements being disposed on the exterior of the dielectric body so as to permit the establishment of capacitance per unit length, inductance per unit length, impedance, attenuation and propagation delay per unit length, and establishing these pre-determined performance parameters within the channels formed by the conductive elements.

A yet further object of the present invention is to provide an improved transmission line in the form of a solid link, of preferably uniform, circular cross-section, the link including at least a pair of conductive elements disposed thereon that serve to guide the electrical wave therethrough, the link including at least one thin filament of dielectric material having two conductive surfaces disposed thereon, the conductive surfaces extending lengthwise of the filament and separated by two circumferential arcuate extents, the conductive surfaces further being separated from each other to form a discrete, two-element transmission channel that reduces the current loop and in which the signal conductors are more tightly aligned.

Yet another object of the present invention is to provide a non-circular transmission line for high speed applications, which includes an elongated rectangular or square dielectric member having an exterior surface with at least four distinct sectors disposed thereon, the dielectric member including a pair of conductive elements aligned with each other and disposed on two of the sectors, while separated by an intervening sector.

The present invention accomplishes the above and other objects by virtue of its unique structure. In one principal aspect, the present invention includes a transmission line that is formed from a dielectric with a preselected dielectric constant and a preselected cross-sectional configuration. A pair of conductive surfaces are disposed on the dielectric line, or link, and one preferably aligned with each other and separated from each other. The conductive surfaces serve as wave guides for guiding electrical waves along the transmission link.

In another principal aspect of the present invention, the conductive elements are grouped together as a pair on a single element, thus defining a unitized wave guide that may be run between and among successive printed circuit boards and connected thereto without difficulty. The conductive surfaces may be formed by selectively depositing conductive material thereon, such as by plating, the exterior surface of the dielectric body, or by molding or otherwise attaching an actual conductor to the body. In this manner, the dielectric may be formed with bends and the conductive surfaces that exist on the surface thereof maintains their spaced apart arrangement of grouped channel conductors along and throughout the bends of the dielectric body.

In yet another principal aspect of the invention, the exterior of the transmission line may be covered by a protective outer jacket, or sleeve. The conductive surfaces may be disposed on the dielectric body in a balanced arrangement with equal widths, or an unbalanced arrangement with one or more pairs of conductive elements, and the conductive elements having different widths. Three conductive elements may be disposed on the dielectric body to support a differential triple on the transmission line utilizing a pair of differential signal conductors and an associated ground conductor. The number of conductive surfaces is limited only by the size of the dielectric body, and four such discrete conductive elements may be used to support two different signal channels or a single differential pair with dual grounds.

In still another principal aspect of the present invention, a unitary transmission line is formed within one cavity, or within a plurality of selectively-sized metallized cavities are formed within a substrate. The substrate is grooved to form the cavities and the sidewalls of the grooves may be plated with a conductive material. The air gap between the sidewalls of the cavities, or grooves, in this instance, serves as the dielectric of the transmission channel. In this structure, the dielectric constant of air is different and less than the dielectric constant of the dielectric body so as to influence electrical affinity, and particularly coupling between the conductive elements in the grooves and not between adjacent signal transmission channels of the transmission line, while increasing transmission speed.

In yet another principal aspect of the present invention, the aforementioned transmission links may be used to carry power. In such circumstances, the underlying transmission line will include a grooved dielectric, with a continuous contact region being formed within the grooves, i.e., covering the sidewalls and bases of the groove. The continuous contact area that is present on these three surfaces for the length of the groove extends the current carrying capability of the structure. A ground plane may be utilized to increase capacitive coupling among the power channels and the ground plane to reduce the source impedance of the overall structure. The transmission line may be formed with projecting ridges, or lands, that serve to define troughs therebetween. The conductive surfaces are formed in the troughs by way of a continuous process, such as selective plating, so that a continuous plated trough, i.e., two sidewalls and an interconnecting base are formed which extend for the length of the transmission line. This increases the current carrying capability of the transmission line. A high capacitance may then be created across the dielectric between two signal conductors to reduce the source impedance of the system.

The power carrying aspect of the invention may be further supplemented by the forming of high density contact sets within the system. In a grooved transmission line the opposing sidewalls of the grooves may be plated with a conductive material to form continuous contacts that extend the length of the transmission line and opposite polarity signals (i.e., "+" and "−") may be carried along these contacts. A plug assembly may be molded, such as by way of insert molding into the grooves, either individually or as an assembly encompassing two or more such grooves to insulate and isolate the opposed contact pairs, which will result in an increased voltage standoff. A conformal coating may also be used to achieve a similar aim.

The transmission lines of the invention may carry both signals and power and thus may be easily divided into separate signal channels and power channels. The signal channels may be made with conductive strips or paths of a preselected width, while the power channels, in order to carry high currents, may include either wider strips or an enlarged, continues conductor strip. The wider strips are enlarged plate areas as compared to the signal strips and have a high capacitance. The signal and power channels may be separated by a wide, non-conductive area of the transmission line that serves as an isolation region. Because the isolation region may be formed during the forming of the underlying dielectric base, the isolation region may be readily defined to minimize cross-contamination or electrical interference.

These and other objects, features and advantages of the present invention will be clearly understood through a consideration of the following detailed description.

BRIEF DESCRIPTION OF THE DRAWINGS

In the course of this detailed description, the reference will be frequently made to the attached drawings in which.

DETAILED DESCRIPTION OF THE PREFERRED EMBODIMENTS

Figure 1:
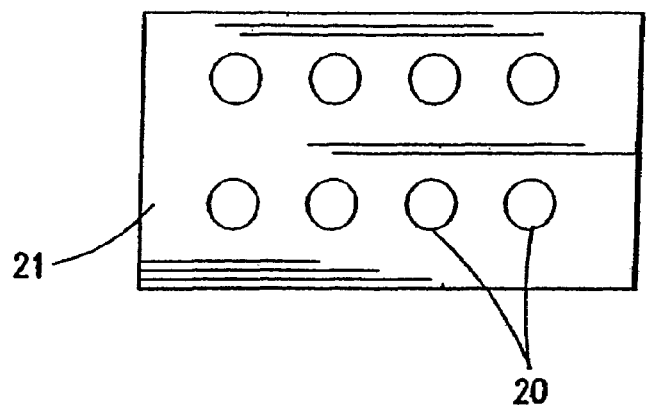
FIG. 1 is a schematic plan view of the terminating face of a conventional connector.
Figure 2:
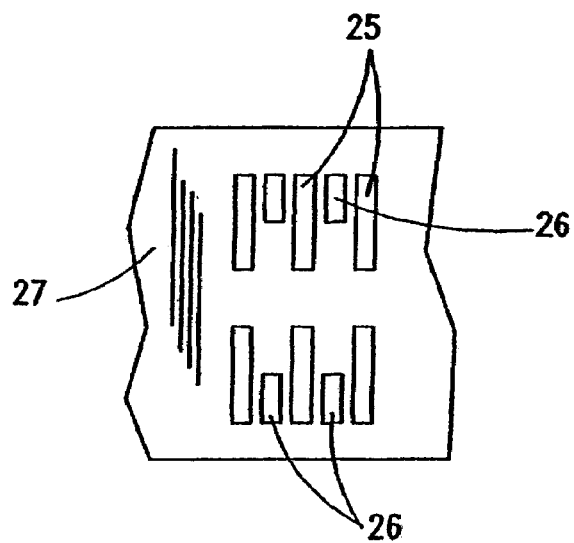
FIG. 2 is a schematic plan view of an edge card used in a high speed connector.
Figure 3:
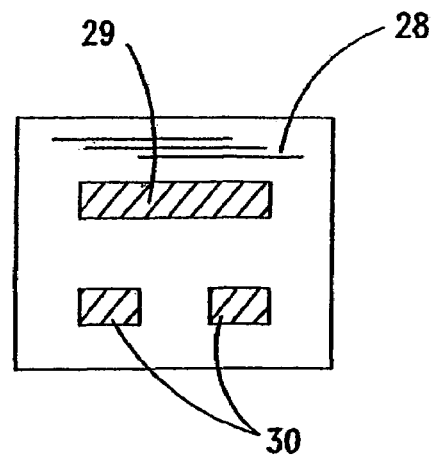
FIG. 3 is a schematic elevational view of a high speed connector utilizing a triad or triple.
Figure 4:
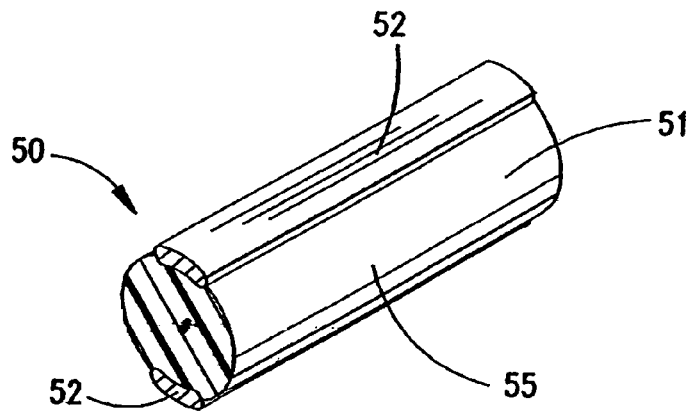
FIG. 4 is a perspective view of a grouped element channel link constructed in accordance with the principles of the present invention.
Figure 5:
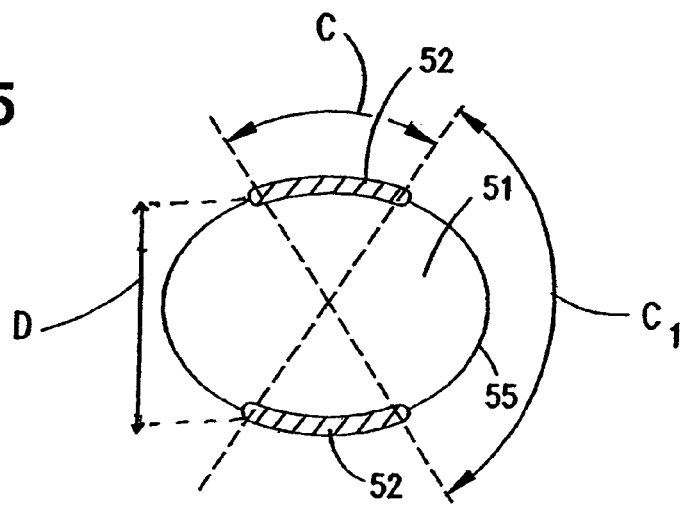
FIG. 5 is a schematic end view of the grouped element channel link of FIG. 4 illustrating the arcuate extents of the conductive elements and the spacing therebetween.

FIG. 4 illustrates a grouped element channel link 50 constructed in accordance with the principles of the present invention. It can be seen that the link 50 includes an elongated, dielectric body 51, preferably a cylindrical filament, that is similar to a length of fiber optic material. It differs therefrom in that the link 50 acts as a pre-engineered wave guide and a dedicated transmission media. In this regard, the body 51 is formed of a dedicated dielectric having a specific dielectric constant and a plurality of conductive elements 52 applied thereto. In FIGS. 4 and 5, the conductive elements 52 are illustrated as elongated extents, traces or strips, 52 of conductive material and, as such, they may be traditional copper or precious metal extents having a definite cross-section that may be molded or otherwise attached, such as by adhesive or other means to the dielectric body of the link 50. They may also be formed on the exterior surface 55 of the body 51 such as by a suitable plating or vacuum deposition process. The conductive traces 52 are disposed on the exterior surface and have a width that extends along the perimeter of the dielectric body.

At least two such conductors are used on each link, typically are used for signal conveyance of differential signals, such as +0.5 volts and –0.5 volts. The use of such a differential signal arrangement permits us to characterize structures of this invention as pre-engineered waveguides that are maintained over substantially the entire length of the signal delivery path. The use of the dielectric body 51 provides for preferred coupling to occur within the link. In the simplest embodiment, as illustrated in FIG. 5, the conductive elements are disposed on two opposing faces, so that the electrical affinity of each of the conductive elements is for each other through the dielectric body upon which they are supported, or in the case of a conductive channel as will be explained in greater detail to follow and as illustrated in FIGS. 29–30, the conductive elements are disposed on two or more interior faces of the cavity/cavities to establish the primary coupling mode across the cavity gap and through an air dielectric. In this manner, the links of the present invention may be considered as the electrical equivalent to a fiber optic channel or extent.

The present invention is directed to electrical waveguides, and not either optical or microwave waveguides. The waveguides of the present invention are intended to maintain electrical signals at desired levels of electrical affinity at high frequencies from about 1.0 Ghz to at least 12.5 Ghz and preferably higher. Optical waveguides, as described in U.S. Pat. No. 6,377,741, issued Apr. 23, 2002, typically rely upon a single outer coating, or cladding, having mirror-like reflective properties to maintain the light particles moving in a selected direction. Openings in the outer coating/cladding will result in a dispersal of the light traveling through the waveguide, which adversely affects the light beam of the waveguide. Microwave waveguides are used at very high frequencies to direct the energy of the microwave beam, rather than transmit it as exemplified by U.S. Pat. No. 6,114,677, issued Sep. 5, 2002 in which a microwave waveguide is used to direct the microwaves at the center portion of an oven. Such a directional aim is also utilized the microwave antenna art. In each instance, these type of waveguides are used to focus and direct the energy of the light of microwave traveling through them, whereas in the present invention, the entire waveguide structure is engineered to maintain an electrical signal at desired frequency (ies) and impedance, capacitance and inductance.

The effectiveness of the links of the present invention are dependent upon the guiding and maintenance of digital signals through the channel link, by utilizing two or more conductive surfaces of electrical containment. This will include maintaining the integrity of the signal, controlling the emissions and minimizing loss through the link. The channel links of the present invention contain the electromagnetic fields of the signals transmitted therethrough by controlling the material of the channel link and the geometries of the system components so that preferred field coupling will be provided. Simply stated, the present invention creates an engineered transmission line by defining a region of electrical affinity, i.e., the dielectric body 51, that is bounded by conductors, i.e., conductive surfaces 52, of opposing charge, i.e., negative and positive differential signals.

As illustrated better in FIG. 5, the two conductive surfaces 52 are arranged on the dielectric body 51 in opposition to each other. The dielectric body 51 shown in FIG. 4 takes the form of a cylindrical rod, while the dielectric body shown in FIG. 5 has an oval-like configuration. In each such instance, the conductive surfaces or traces 52, extend for distinct arc lengths. Both FIGS. 4 and 5 are representative of a "balanced" link of the invention where the circumferential extent, or arc length C of the two conductive surfaces 52 is the same, and the circumferential extents or arc lengths C1 of the non-conductive exterior surfaces 55 of the dielectric body 51 are also the same. This length may be considered to define a gross separation D between the conductive surfaces. As will be explained below, the link may be "unbalanced" with one of the conductive surfaces having an arc length that is greater than the other, and in such an instance, the transmission line is best suited for single-ended, or non-differential signal applications. In instances where the dielectric body and link are circular, the link may serve as a contact pin and so be utilized in connector applications. This circular cross-section demonstrates the same type of construction as a conventional round contact pin.

Figure 6:
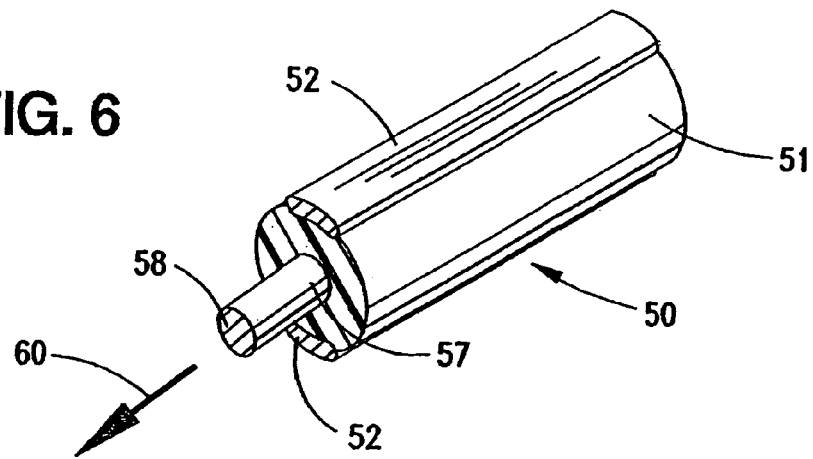
FIG. 6 is a perspective view of an alternate embodiment of a grouped element channel link constructed in accordance with the principles of the present invention.

As illustrated in FIG. 6, the links of the present invention may be modified to provide not only multiple conductive elements as part of the overall system transmission media, but may also incorporate a coincident and coaxial fiber optic wave guide therewithin for the transmission of light and optical signals. In this regard, the dielectric body 51 is cored to create a central opening 57 through which an optical fiber 58 extends. Electrical signals may be transmitted through this link as well as light signals 60.

Figure 7:
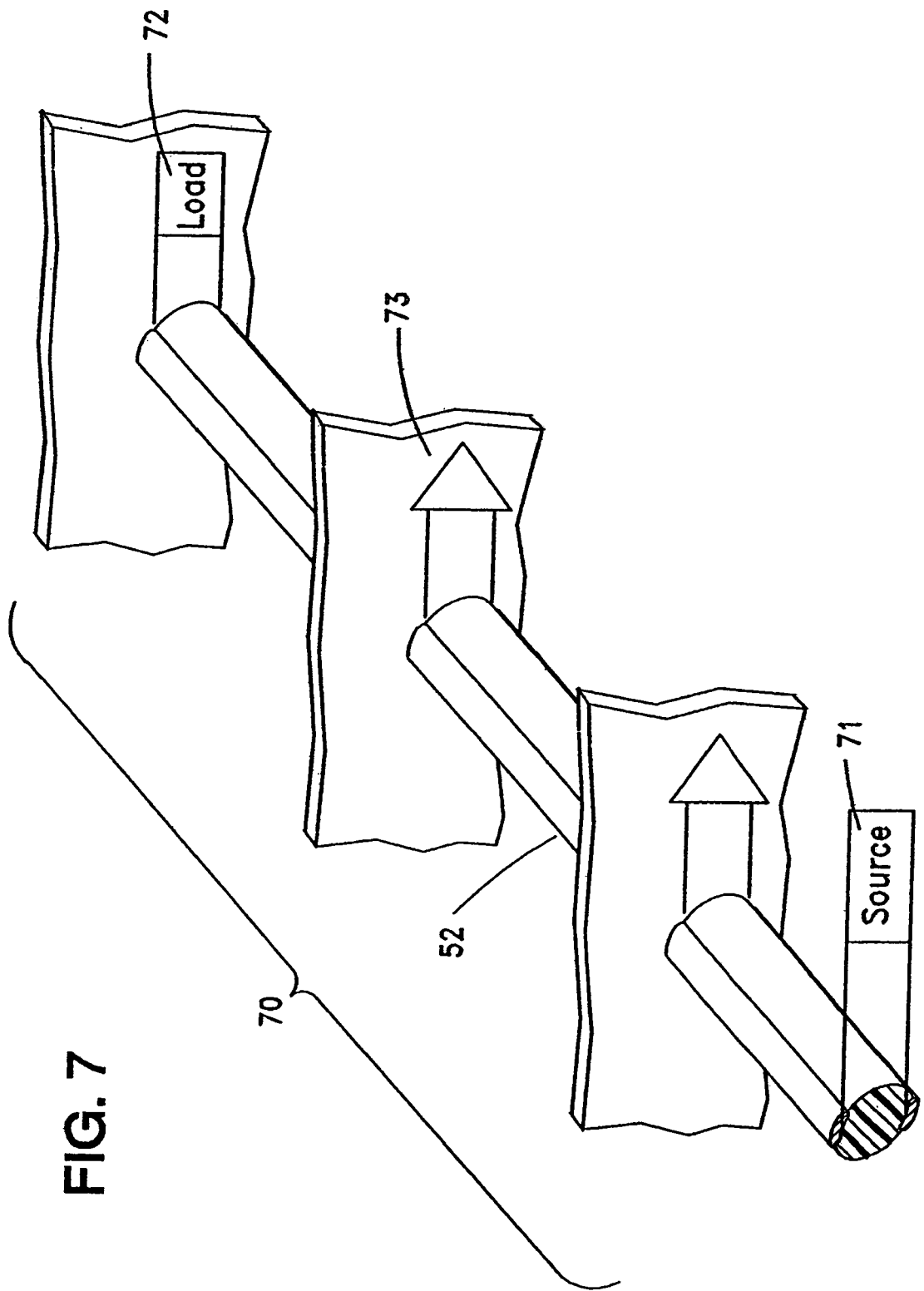
FIG. 7 is a schematic view of a transmission link of the present invention used to connect a source with a load having intermediate loads on the transmission link.

FIG. 7 schematically illustrates a transmission line 70 incorporating a link 50 of the present invention that extends between a source 71 and a load 72. The conductive surfaces 52 of the link serve to interconnect the source and load together, as well as other secondary loads 73 intermediate the source and the load. Such secondary loads may be added to the system to control the impedance through the system. A line impedance is established at the source and may be modified by adding secondary loads to the transmission line.

Figure 8:
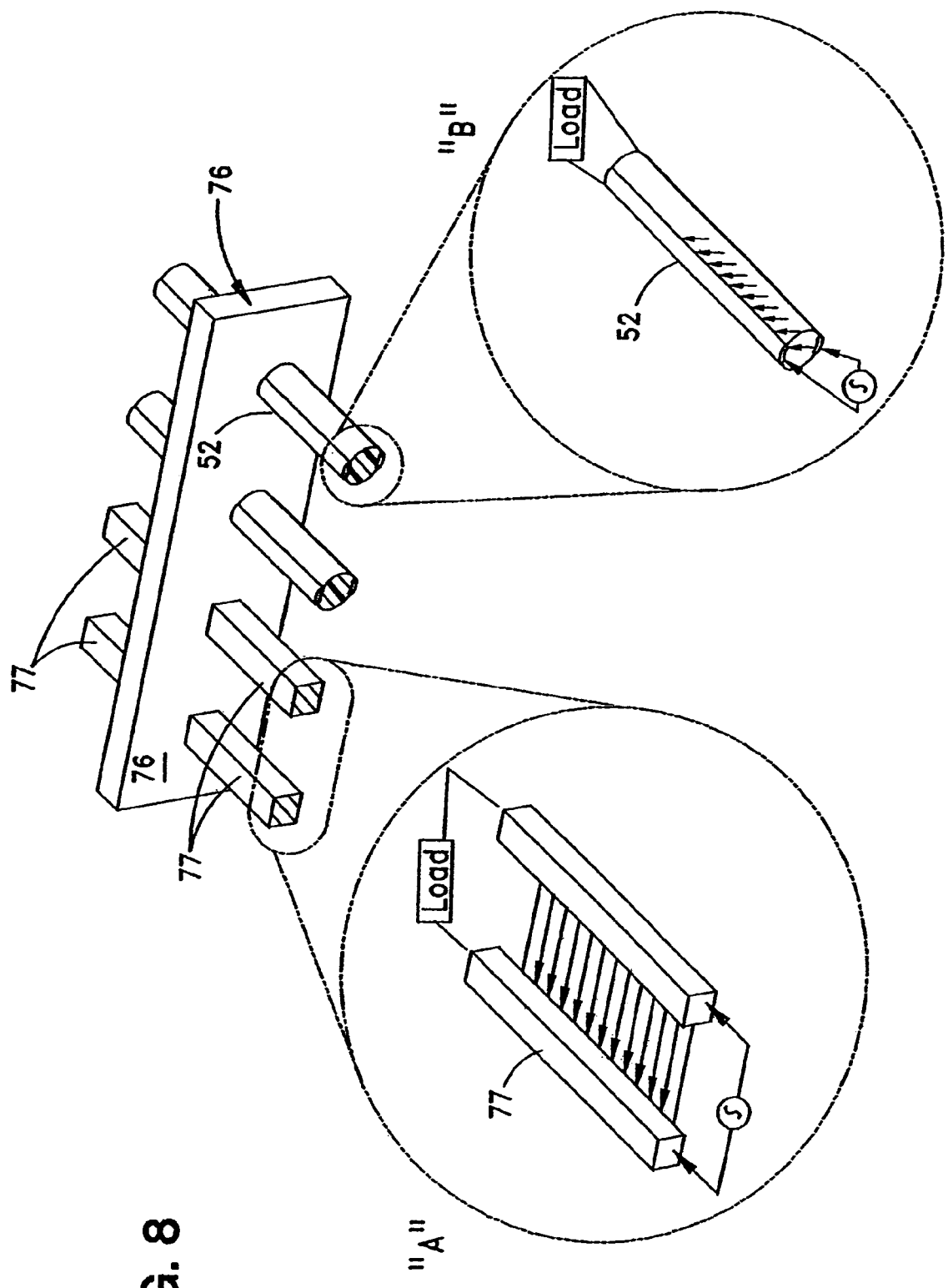
FIG. 8 is a schematic view of a connector element utilizing both conventional contacts "A" and the transmission links "B" of the invention, with enlarged detail portions at "A" and "B" thereof, illustrating the occurrence of inductance in the respective systems.
Figure 9:
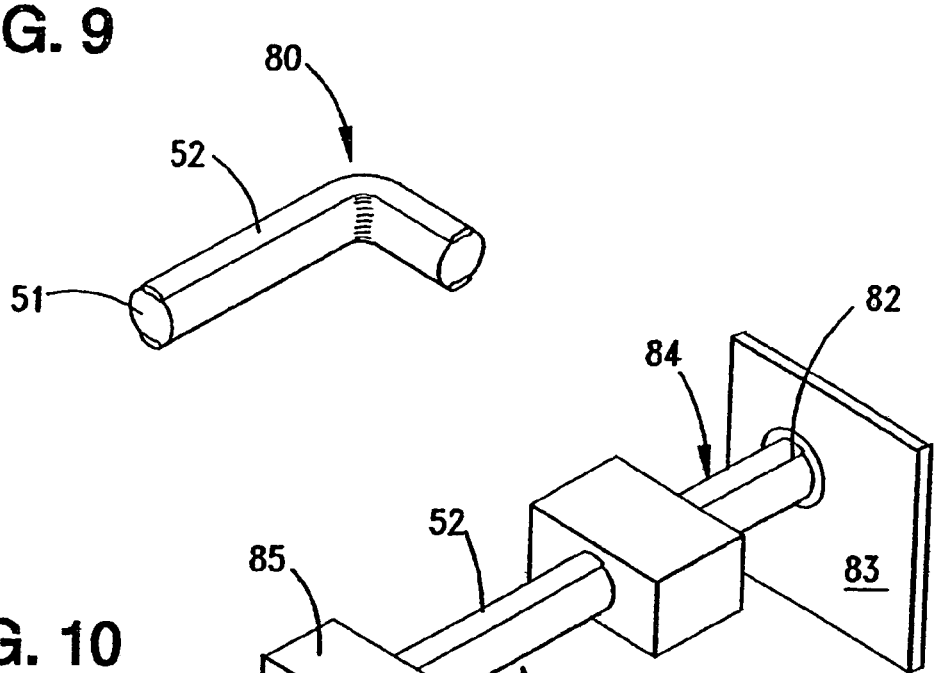
FIG. 9 is a perspective view of an alternate construction of a link of the invention with a right angle bend formed therein.

FIG. 8 illustrates, schematically, the difference between the links of the present invention and conventional conductors, which are both illustrated as supported by a dielectric block 76. Two discrete, conventional conductors 77 are formed from copper or another conductive material and extend through the block 76, in the manner of pins. As shown in enlargement "A", the two discrete conductor presents an open cell structure with a large inductance (L) because of the enlarged current loop. Quite differently, the links of the present invention have a smaller inductance (L) at a constant impedance due to the proximity of the conductive surfaces to each other as positioned as the dielectric body 51. The dimensions of these links 50 can be controlled in the manufacturing process and extrusion will be the preferred process of manufacturing with the conductive surfaces being extended with the dielectric body or separately applied of the extrusion, such as by a selective plating process so that the resulting construction is of the plated plastic variety. The volume of the dielectric body 51 and the spacing between conductive elements disposed thereon may be easily controlled such an extrusion process. The conductive surfaces preferably extend for the length of the dielectric body and may end slightly before the ends thereof at a location where it is desired to terminate the transmission line to a connector, circuit board or similar component, As FIG. 9 illustrates, the dielectric body may have a bend 80 forward therewith in the form of the 90° right-angle bend illustrated or in any other angular orientation. As shown, the conductive surfaces 52 extend through the bend 80 with the same separation spacing between them and the same width with which the conductive surfaces start and end. The dielectric body 51 and the conductive surfaces 52 are easily maintained in their spacing and separation through the bend to eliminate any potential losses.

Figure 10:
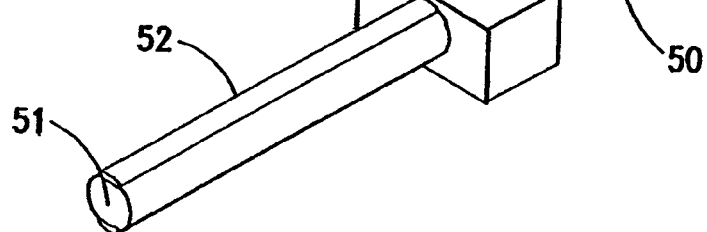
FIG. 10 is a schematic view of a transmission line utilizing the links of the present invention.

FIG. 10 illustrates a transmission line using the links of the invention. The link 50 is considered as a transmission cable formed from one or more single dielectric bodies 51, and one end 82 of it is terminated to a printed circuit board 83. This termination may be direct in order to minimize any discontinuity at the circuit board. A short transfer link 84 that maintains any discontinuities at a minimum is also provided. These links 84 maintain the grouped aspect of the transmission link. Termination interfaces 85 may be provided where the link is terminated to the connector with minimum geometry discontinuity or impedance discontinuity. In this manner, the grouping of the conductive surfaces is maintained over the length of the transmission line resulting in both geometric and electrical uniformity.

Figure 11:
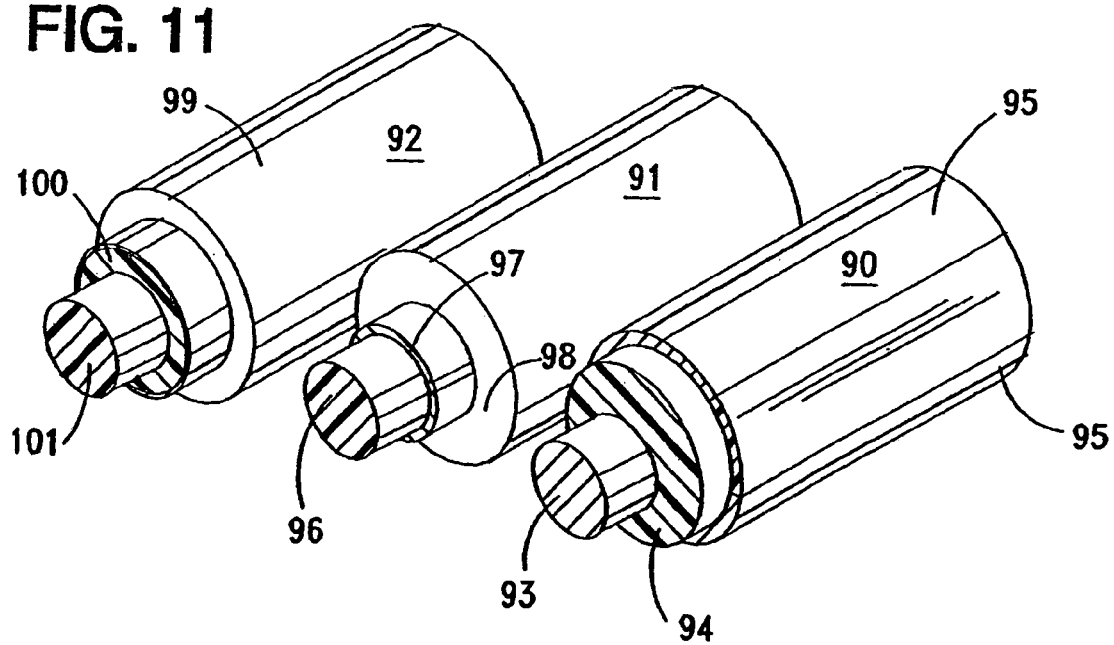
FIG. 11 is a perspective view illustrating alternate media compositions of the links of the invention.

FIG. 11 illustrates a variety of different cross-sections of the transmission links 50 of the invention. In the rightmost link 90, a central conductor 93 is encircled by a hollow dielectric body 94 which in turn, supports multiple conductive surfaces 95 that are separated by an intervening space, preferably filled with portions of the dielectric body 94. This construction is suitable for use in power applications where power is carried by the central conductor 93. In the middle link 91 of FIG. 11, the central cover 96 is preferably made of a selected dielectric and has conductive surfaces 97 supported on it. A protective outer insulative jacket 98 is preferably provided to protect and or insulate the inner link. The leftmost link 92 of FIG. 11 has a protective outer jacket 99 that encloses a plateable polymeric ring 100 that encircles either a conductive or insulative core 101. Portions 101 of the ring 100 are plated with a conductive material and are separated by unplated portions to define the two or more conductive surfaces desired on the body of the ring. Alternatively, one or the elements surrounding the core or of the link 92 may be filled with air and may be spaced away from an inner member by way of suitable standoffs or the like.

Figure 12:
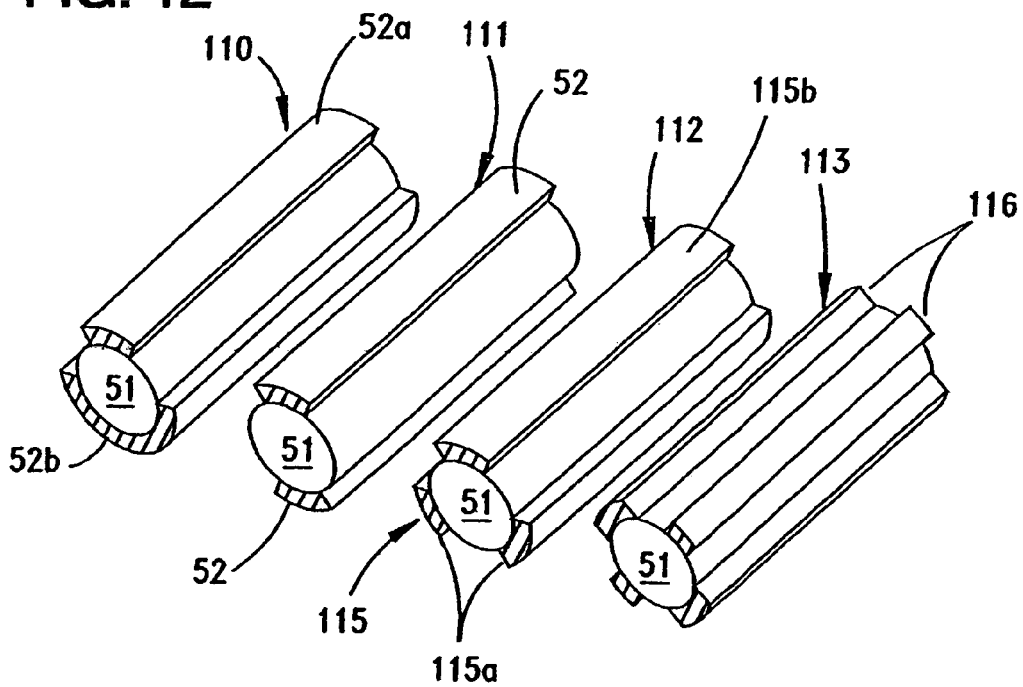
FIG. 12 is a perspective view of an array of different shapes of dielectric bodies illustrating alternate conductive surface arrangements.

FIG. 12 illustrates an array of links 110–113 that have their outer regions combined with the dielectric body 51 to form different types of transmission links. Link 110 has two conductive surfaces 52a, 52b of different arc lengths (i.e., unbalanced) disposed on the outer surface of the dielectric body 51 so that the link 110 may provide single-ended signal operation. Link 111 has two equal-spaced and sized (or "balanced") conductive elements 52 to provide an effective differential signal operation.

Link 112 has three conductive surfaces 115 to support two differential signal conductors 115a and an assorted ground conductor 115b. Link 113 has four conductive surfaces 116 disposed on its dielectric body 51 in which the conductive surfaces 116 may either include two differential signal channels (or pairs) or a single differential pair with a pair of associated grounds.

Figure 13:
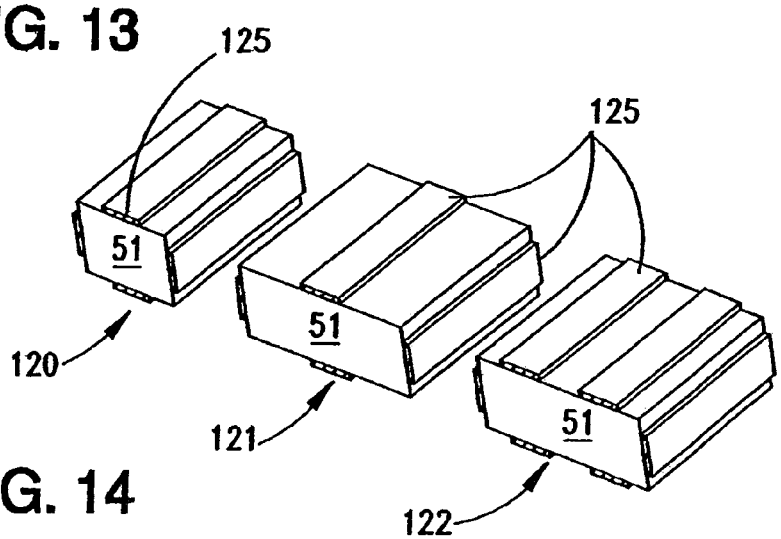
FIG. 13 is a perspective view of an array of non-circular cross-section dielectric bodies that may be used to form links of the invention.

FIG. 13 illustrates an array of one-type of non-circular links 120–122 that polygonal configurations, such as square configurations, as with link 120 or rectangular configurations as with links 121–122. The dielectric bodies 51 may be extruded with projecting land portions 125 that are plated or otherwise covered with conductive material. Individual conductive surfaces are disposed on individual sides of the dielectric body and preferably differential signal pairs of the conductive surfaces are arranged on opposing sides of the body. These land portions 125 may be used to "key" into connector slots of terminating connectors in a manner so that contact between the connector terminals (not shown) and the conductive faces 125 is easily effected.

Figure 14:
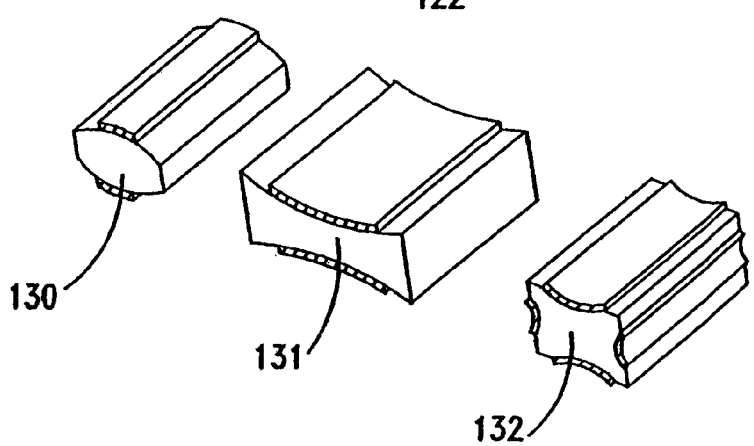
FIG. 14 is a perspective view of another array of non-circular cross-section dielectric bodies suitable for use as links of the invention.

FIG. 14 illustrates some additional dielectric bodies that may be utilized with the present invention. One body 130 is shown as convex, while the other two bodies 131, 132 are shown as being generally concave in configuration. A circular cross-section of the dielectric bodies has a tendency to concentrate the electrical field strength at the corners of the conductive surfaces, while a slightly convex form as shown in body 130, has a tendency to concentrate the field strength evenly, resulting in lower attenuation. The concave bodies, as illustrated by dielectric bodies 131, 132 may have beneficial crosstalk reduction aspects because it focuses the electrical field inwardly. The width or arc lengths of these conductive surfaces, as shown in FIG. 14 are less that the width or arc lengths of the respective body sides supporting them.

Importantly, the transmission link may be formed as a single extrusion 200 (FIGS. 15–16) carrying multiple signal channels thereupon, with each such channel including a pair of conductive surface 202–203. These conductive surfaces 202, 203 are separated from each other by the intervening dielectric body 204 that supports them, as well as web portions 205 that interconnect them together. This extrusion 200 may be used as part of an overall connector assembly 220, where the extrusion is received into a complementary shaped opening 210 formed in a connector housing 211. The inner walls of the openings 210 may be selectively plated, or contacts 212 may be inserted into the housing 211 to contact the conductive surfaces and provide, if necessary, surface mount or through hole tail portions.

Figure 17:
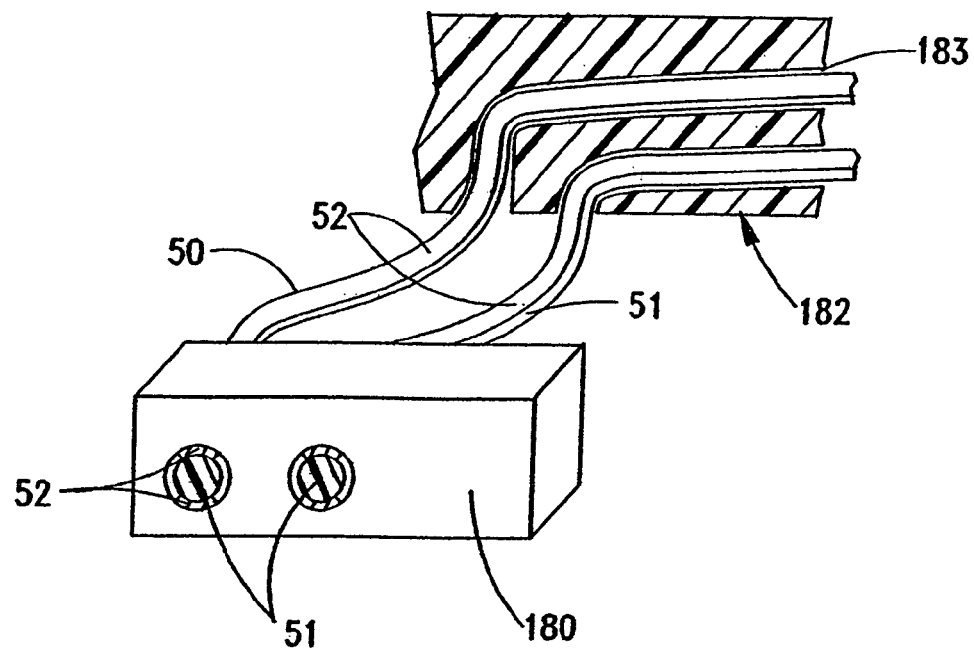
FIG. 17 is a diagrammatic view of a transmission channel of the present invention with two interconnecting blocks formed at opposite ends of the channel and illustrating the potential flexible nature of the invention.

FIG. 17 illustrates the arrangement of two transmission channels 50 arranged as illustrated and terminated at one end to a connector block 180 and passing through a right angle block 182 that includes a series of right angle passages 183 formed therein which receive the transmission channel links as shown. In arrangements such as that shown in FIG. 17, it will be understood that the transmission channel links may be fabricated in a continuous manufacturing process, such as by extrusion, and each such channel may be manufactured with intrinsic or integrated conductive elements 52. In the manufacturing of these elements, the geometry of the transmission channel itself may be controlled, as well as the spacing and positioning of the conductive elements upon the dielectric bodies so that the transmission channels will perform as consistent and unitary electronic waveguides which will support a single channel or "lane" of signal (communication) traffic. Because the dielectric bodies of the transmission channel links may be made rather flexible, the systems of the invention are readily conformable to various pathways over extended lengths without significantly sacrificing the electrical performance of the system. The one connector endblock 180 may maintain the transmission channels in a vertical alignment, while the block 182 may maintain the ends of the transmission channel links in a right angle orientation for termination to other components.

Figure 18:
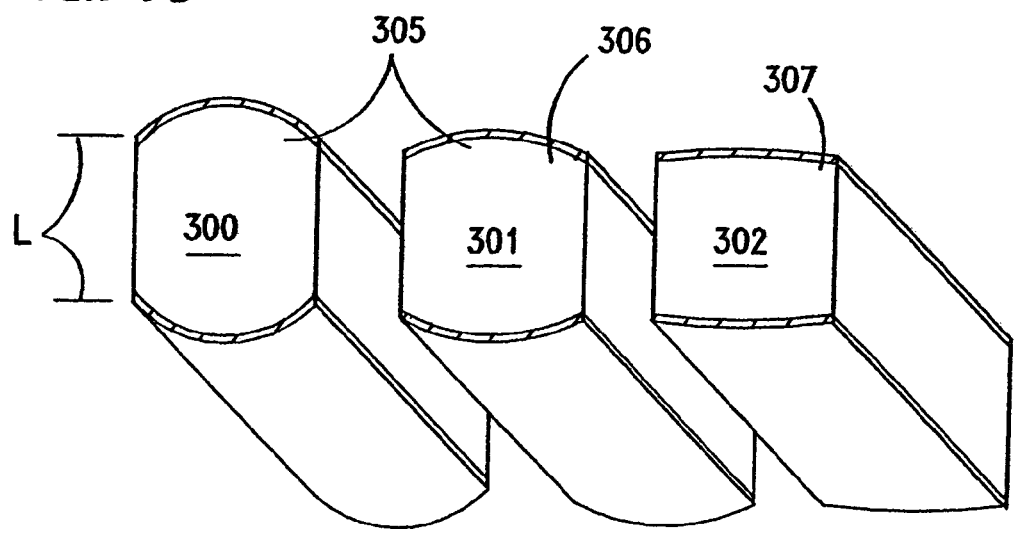
FIG. 18 is a perspective view of an array of differently configured dielectric bodies that may be used as links of the with different lens characteristics.

FIG. 18 illustrates a set of convex dielectric blocks or bodies 300–302 in which separation distance L varies and the curve 305 of the exterior surfaces 306 of the blocks rises among the links 300–302. In this manner, it should be understood that the shapes of the bodies may be chosen to provide different lens characteristics for focusing the electrical fields developed when the conductive elements are energized.

Figure 19:
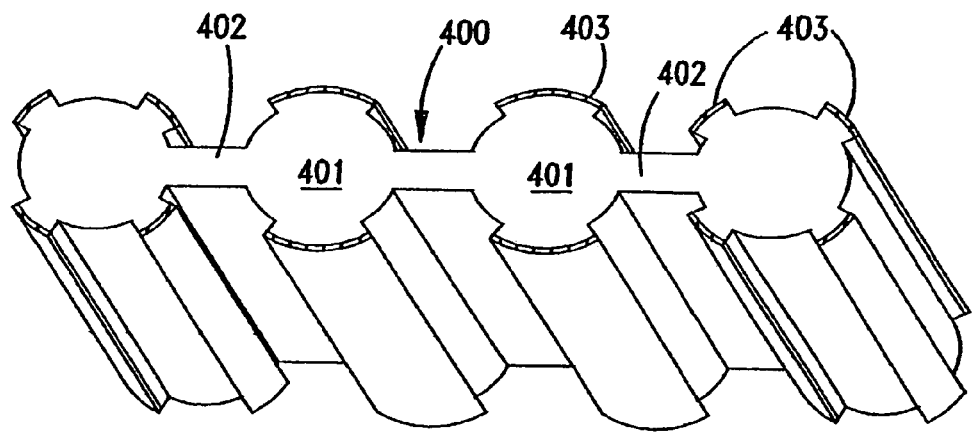
FIG. 19 is a perspective view of a multiple transmission link extrusion with different signal channels formed thereon.

FIG. 19 illustrates a multiple channel extrusion 400 with a series of dielectric bodies or blocks 401 interconnected by webs 402 in which the conductive surfaces 403 are multiple or complex in nature. As with the construction shown in FIG. 13, such an extrusion 400 supports multiple signal channels, with each of the channels preferably including a pair of differential signal conductive elements.

Figure 16:
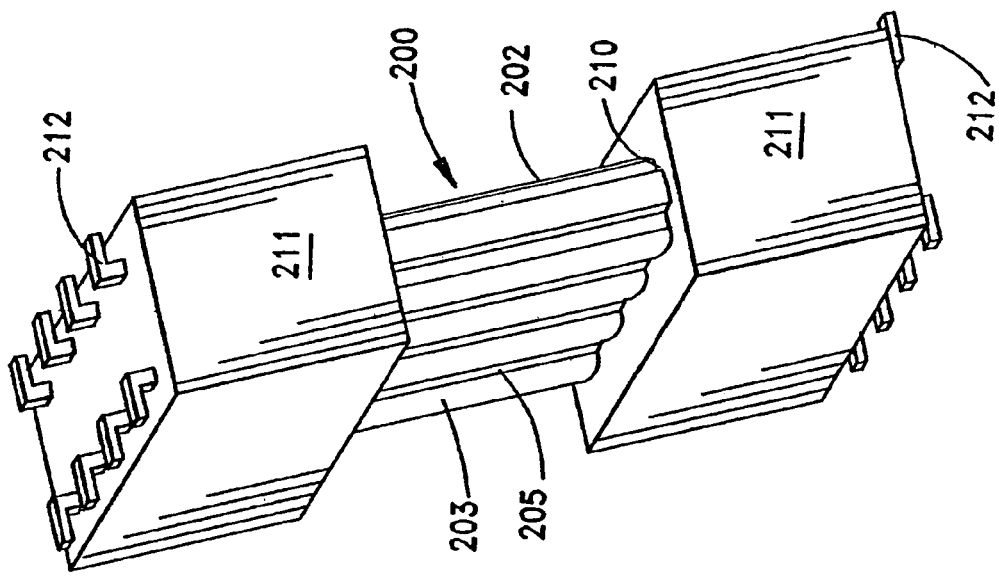
FIG. 16 is a perspective view of a connector assembly having two connector housings interconnected by the transmission link of FIG. 15.
Figure 15:
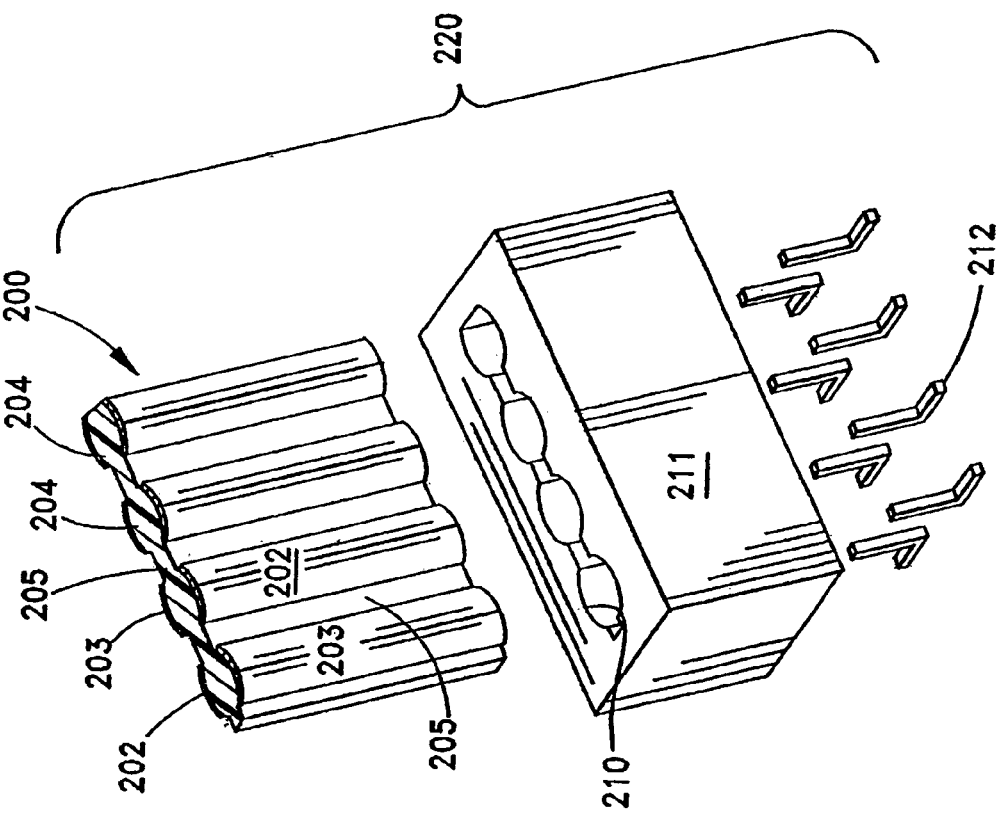
FIG. 15 is an exploded view of a connector assembly incorporating a multiple element link of the invention that is used to provide a transmission line between two connectors.
Figure 20:
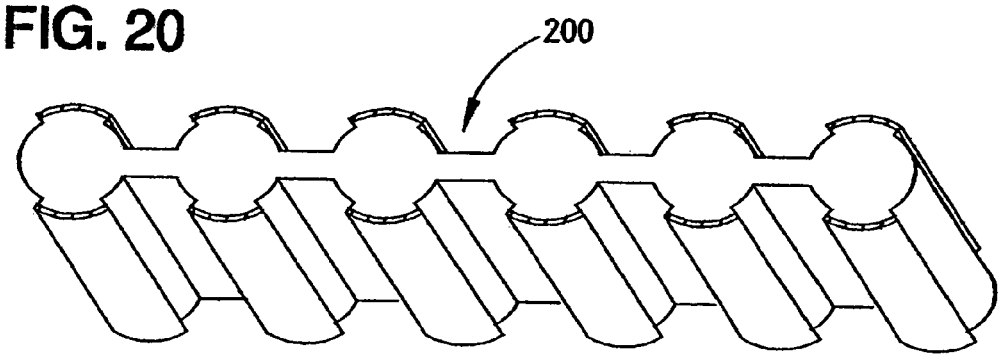
FIG. 20 is a perspective view of a multiple transmission link extrusion used in the invention.

FIG. 20 illustrates a standard extrusion 200 such as that shown in FIGS. 15 and 16.

Figure 21:
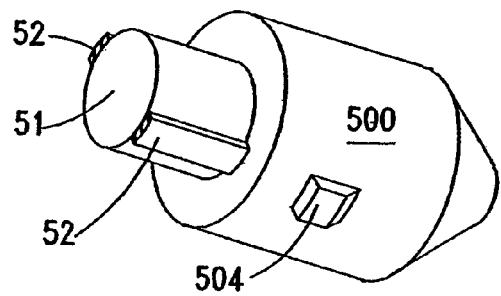
FIG. 21 is a perspective view of a mating interface used with a discrete transmission link of the invention, in which mating interface takes the form of a hollow endcap.
Figure 22:
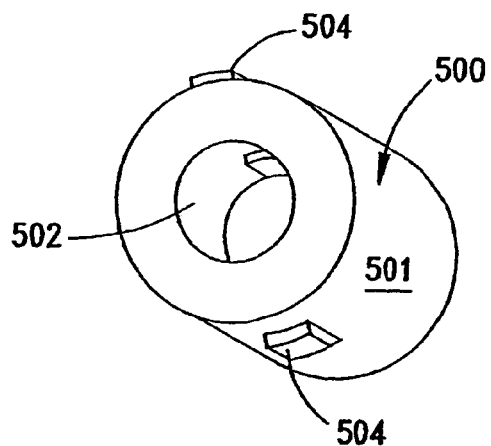
FIG. 22 is a rear perspective view of the endcap of FIG. 21, illustrating the center opening thereof that receives an end portion of the transmission link therein.
Figure 23:
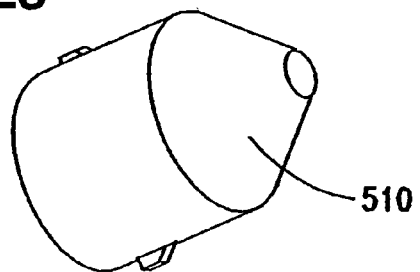
FIG. 23 is a frontal perspective view of the endcap of FIG. 21, illustrating the orientation of the exterior contacts.

The links of the present invention may be terminated into connector and other housings. FIGS. 21–23 illustrate one termination interface as a somewhat conical endcap which has a hollow body 501 with a central openings 502. The body may support a pair of terminals 504 that mate with the conductive surfaces 52 of the dielectric body 51. The endcap 500 may be inserted into various openings in connector housings or circuit boards and as such, preferably includes a conical insertion end 510. The endcap 500 may be structured to terminate only a single transmission line as is illustrated in FIGS. 21–23, or it may be part of a multiple termination interface and terminate multiple distinct transmission lines as illustrated in FIGS. 24 and 25.

Figure 24:
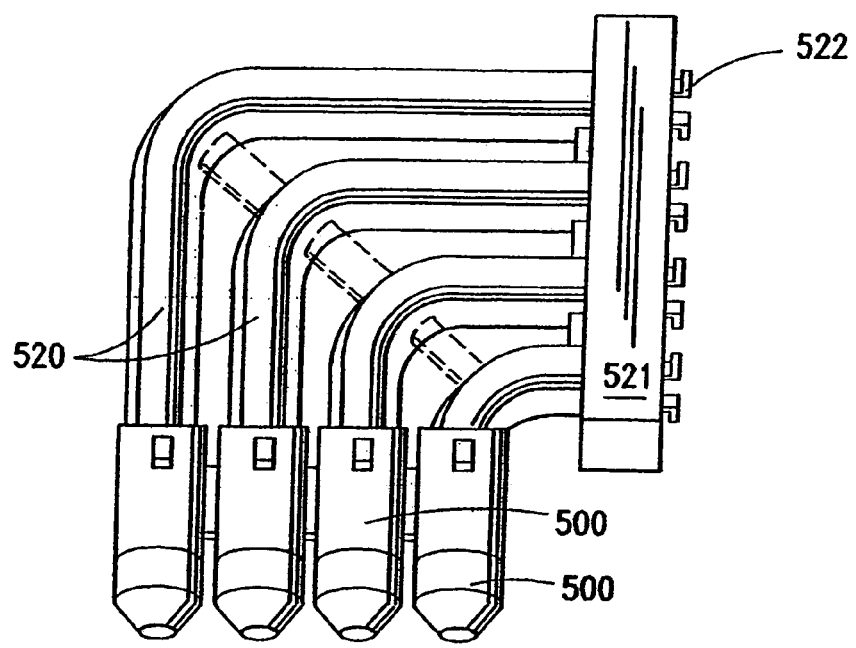
FIG. 24 is a plan view of a multiple transmission link right angle, curved connector assembly.

FIG. 24 illustrates the endcaps 500 in place on a series of links 520 that are terminated to an endblock 521 that has surface mount terminals 522 so that the endblock 521 may be attached to a circuit board (not shown). The endcap need not take the conical structure shown in the drawings, but may take other shapes and configurations similar to that shown and described below.

Figure 25:
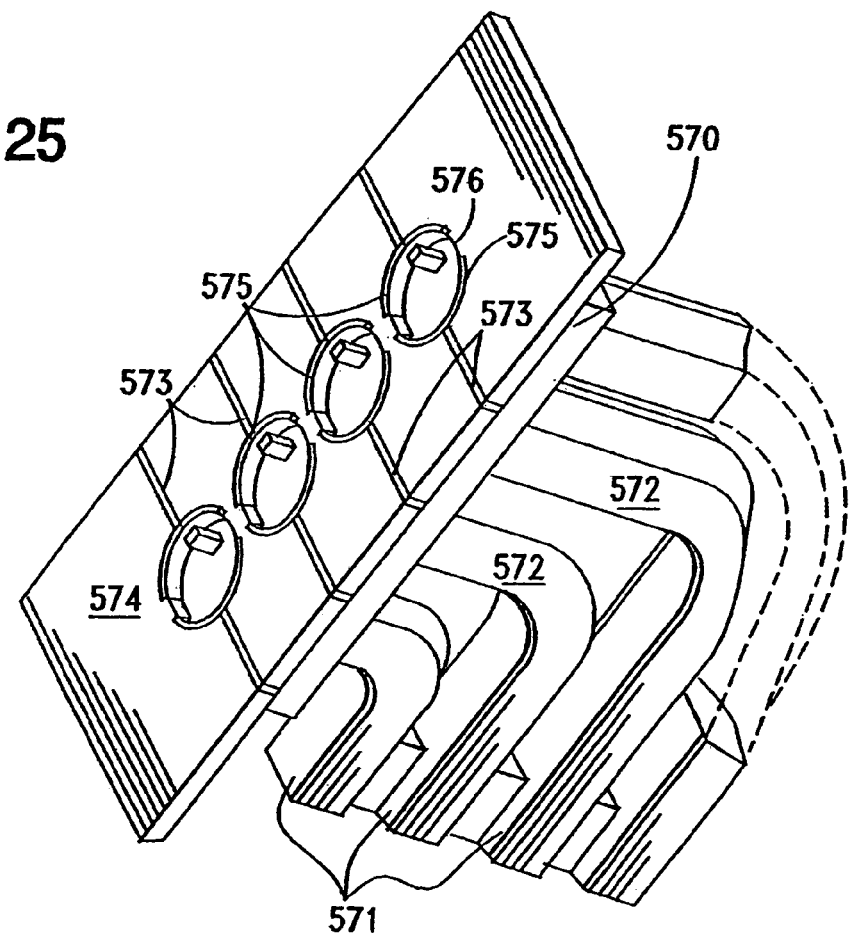
FIG. 25 is a perspective view of an alternate construction of one of the termination ends of the connector assembly.

FIG. 25 illustrates an alternate construction of an end block 570. In this arrangement, the transmission lines, or links 571, are formed from a dielectric and include a pair of conductive extents 572 formed on their exterior surfaces (with the extents 572 shown only on one side for clarity and their corresponding extents being formed on the surfaces of the links 571 that face into the plane of the paper of FIG. 25). These conductive extents 572 are connected to traces 573 on a circuit board 574 by way of conductive vias 575 formed on the interior of the circuit board 574. Such vias may also be constructed within the body of the end block 570, if desired. The vias 575 are preferably split as shown and their two conductive sections are separated by an intervening gap 576 to maintain separation of the two conductive transmission channels at the level of the board.

Figure 26:
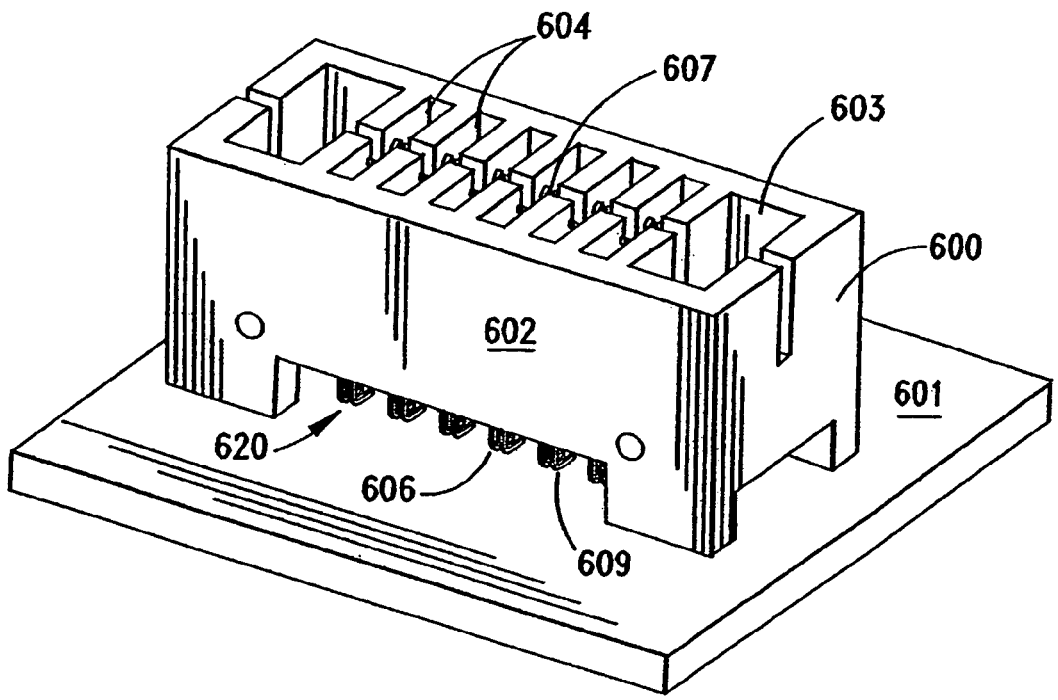
FIG. 26 is a perspective view of a connector suitable for use in connecting transmission channel links of the present invention to a circuit board.

FIG. 26 illustrates an endcap, or block 600 mounted to a printed circuit board 601. This style of endcap 600 serves as a connector and thus includes a housing 602, with a central slot 603 with various keyways 604 that accept projecting portions of the transmission link. The endcap connector 600 may have a plurality of windows 620 for access to soldering the conductive tail portions 606 of the contacts 607 to corresponding opposing traces on the circuit board 601. In instances of surface mount tails a shown, the tails 606 may have their horizontal parts 609 tucked under the body of the endcap housing to reduce the circuit board pad size needed, as well as the capacitance of the system at the circuit board.

Figure 27A:
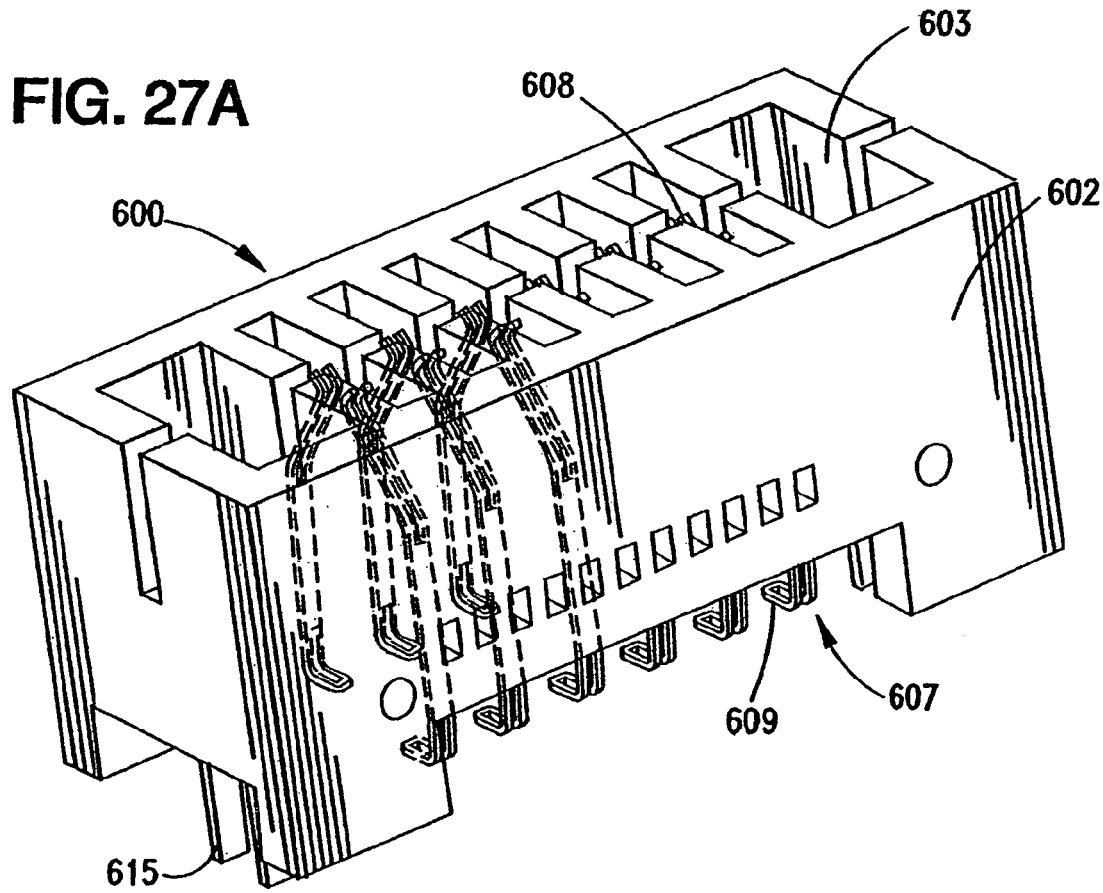
FIG. 27A is a skeletal perspective view of the connector of FIG. 26 illustrating, in phantom, some of the internal contacts of the connector.
Figure 27B:
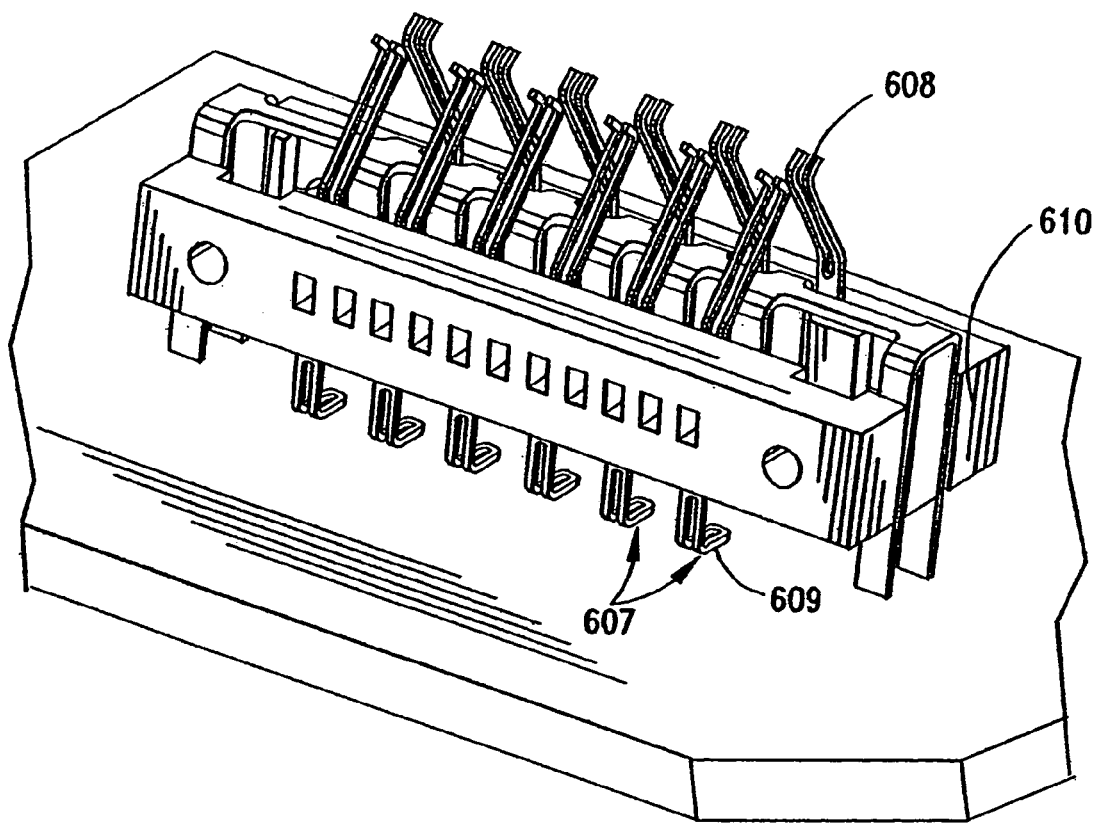
FIG. 27B is a perspective view of the interior contact assembly of the connector of FIG. 27A, with the sidewalls removed and illustrating the structure and placement of the coupling staple thereon.

FIG. 27A illustrates a partial skeletal view of the endcap connector 600 and shows how the contacts, or terminals 607 are supported within and extend through the connector housing 602. The terminals 607 may include a dual wire contact end 608 for redundancy in contact (and for providing a parallel electrical path) and the connector 600 may include a coupling staple 615 that has an inverted U-shape and which enhances coupling of the terminals across the housing. The coupling staple 615 can be seen to have an elongated backbone that extends lengthwise through the connector housing 602. A plurality of legs that are spaced apart from each other by spaces along the length of the coupling staple extend down toward the circuit board and each such leg has a width that is greater than a corresponding width of the terminal that it opposes. As shown in the drawings, the coupling staple legs are positioned in alignment with the terminals. The tail portions of these dual wire terminals 607 enhance the stability of the connector. In this regard, it also provides control for the terminals that constitute a channel (laterally) across the housing slot 601. The dual contact path not only provides for path . . . redundancy but also reduces the inductance of the system through the terminals. FIG. 27B is a view of the interior contact assembly that is used in the endcap connector 600 of FIGS. 26 and 27A. The terminals 607 are arranged on opposite sides of the connector and are mounted within respective support blocks 610. These support blocks 610 are spaced apart from each other a preselected distance that assists in spacing the terminal contacts 608 apart.

A conductive coupling staple 615 having an overall U-shape, or blade shape, may be provided and may be interposed between the terminals 607 and support blocks 610 to enhance the coupling between and among the terminals 607. The coupling staple 615 has a series of blades 620 that are spaced apart by intervening spaces 621 and which are interposed between pairs of opposing contacts (FIG. 28) 6087 and which extend downwardly toward the surface of the circuit board. The staple 615 extends lengthwise through the connector body between the connector blocks 610. The connector blocks 610 and the connector housing 602 (particularly the sidewalls thereof) may have openings 616 formed therein that receive engagement plugs 617 therein to hold the two members in registration with each other. Other means of attachment may be utilized, as well.

Figure 28:
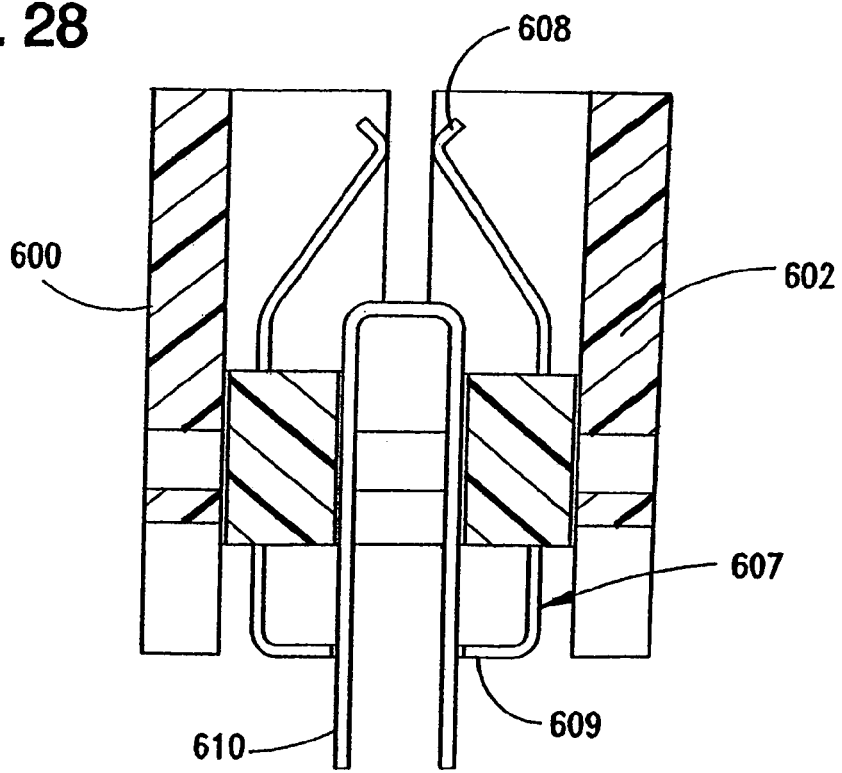
FIG. 28 is a cross-sectional view of the connector of FIG. 26, taken along ines 28—28 thereof.

FIG. 28 is an end view of the connector 600 which illustrates the interposition of the coupling staple between a pair of opposing contacts 608 and the engagement of the connector blocks 610 and the connector housing 602.

Figure 29A:
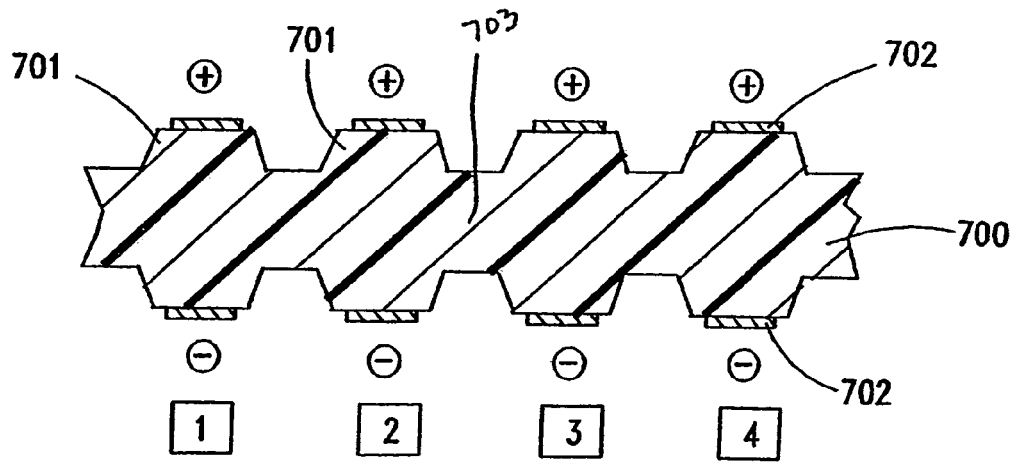
FIGS. 29A–C are end views of other embodiments of transmission channel links that utilize, in FIG. 29A, the dielectric body of the transmission channel for the medium through which coupling is effected, and in FIGS. 29B–C, the air spacing between the conductive elements as the medium through which coupling is effected.
Figure 29B:
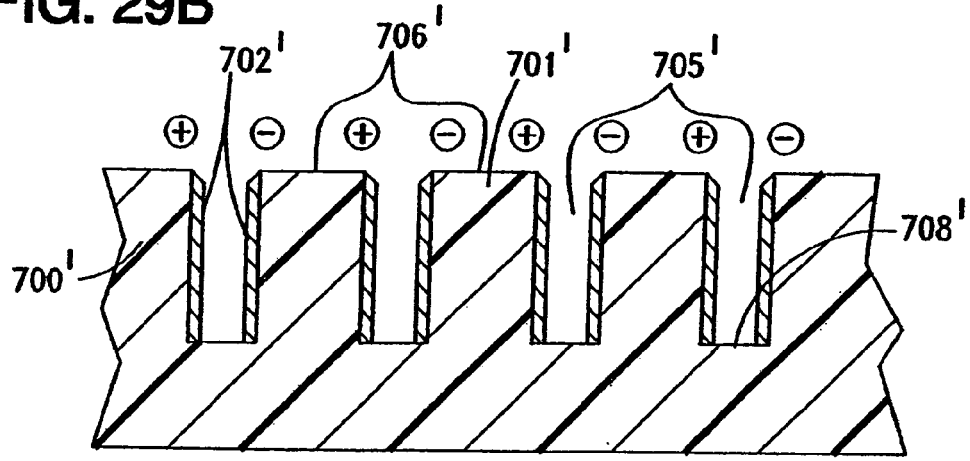
Figure 29C:
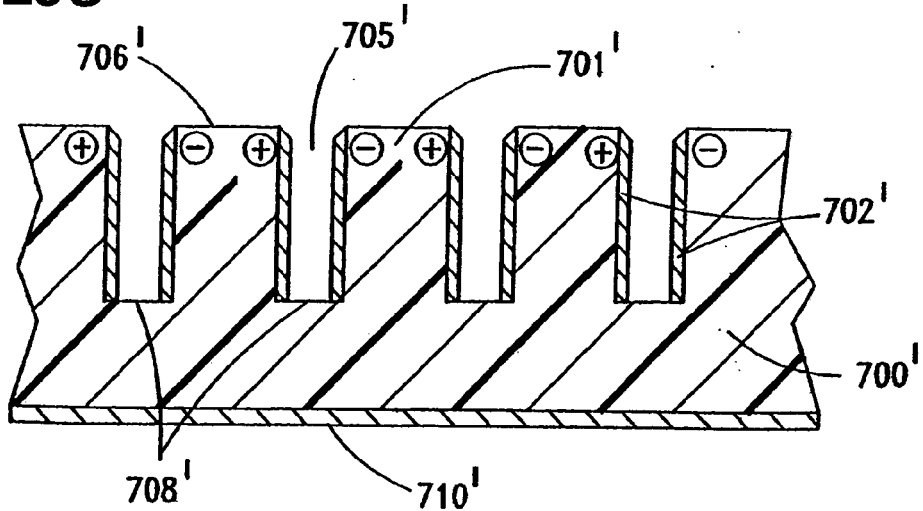
Figure 30:
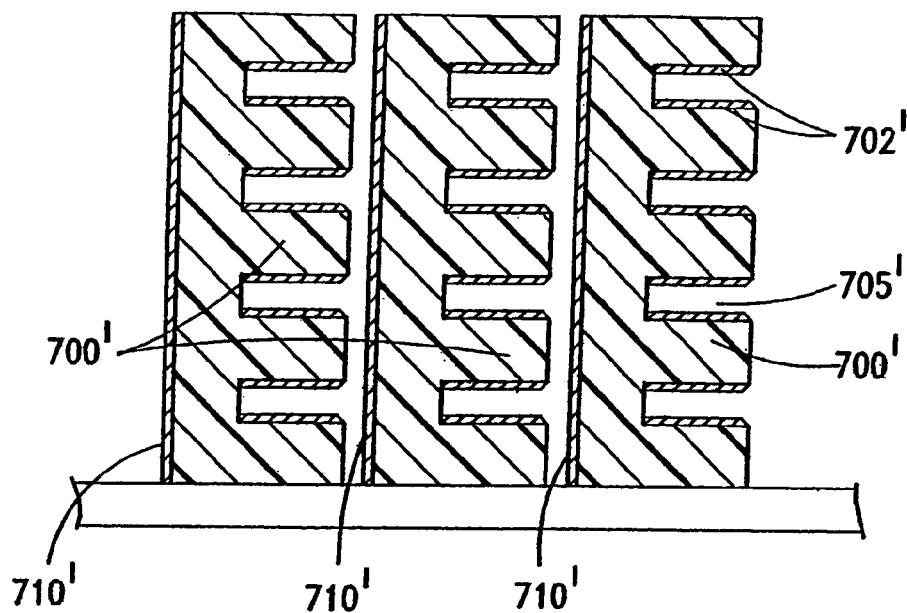
FIG. 30 is an end view of an array of transmission channel links of FIG. 29C arranged on a mount and illustrating the packing of transmission channels that may be obtained with the present invention.

FIGS. 29A–C illustrate another embodiment of a transmission channel link constructed in accordance with the principles of the present invention utilizing air as the dielectric and utilizing broadside coupling between conductive elements. In FIG. 29A, a dielectric substrate 700 is provided of generally uniform cross-section and has enlarged body, or land portions 701, formed at intervals thereon, with conductive elements 702 disposed on opposite surfaces of the substrate 700. The body portions 701 are shown interconnected by web portions 703 that have a thickness that is less than the thickness of the body portions 701. As shown in FIG. 29A, the enlarged body portions 701 are preferably aligned with each other, as are the conductive surfaces supported thereby.

The conductive elements are preferably plated surfaces of the substrate 700, or a layer formed by a suitable deposition process. In this manner, vertical signal channels are thereby defined in this arrangement, which are identified in the boxes "1–4" appearing below each of the bodies 701 in FIG. 29A. The polarity of the conductive elements 702 may be arranged to provide for differential signal transmission, and as illustrated, one such arrangement locates the positive ("+") signal conductive surfaces on one side and the negative ("−") conductive surfaces on the other, and preferably opposite side of the dielectric substrate. As will be understood in the art, the opposite polarity conductive extents 702 will constitute, pairs or signal channels, shown labeled from "1" to "4" underneath FIG. 29A. In this embodiment, the opposite conductive pairs are separated by the volume and extent of the intervening and supporting dielectric substrate. This construction is suitable for mezzanine configurations and utilizes a structured non-air dielectric.

FIG. 29B illustrates a variation in structure of such a connector with a dielectric body or substrate 700' having a plurality of slots 705' formed therein that are spaced apart from each other along the width of the substrate and which uses air as its selected dielectric between the two conductive elements of each signal channel. Conductive surfaces 702' are disposed on the facing sides (or sidewalls) of the slots and are spaced apart from each by an intervening gap, which is filled with air. In this structure, the polarity of the conductive surfaces may be chosen as shown to have negative and positive signal conductive surfaces facing each other, as shown in FIG. 29B, thereby utilizing the air on the slot 705' as the dielectric between the associated pairs of conductive surfaces. Whereas in the embodiment of FIG. 29A, the signal pairs or channels were arranged vertically, or through the dielectric body, in the embodiment of FIGS. 29B and 29C, the arrangement and electrical affinity thereof is horizontally and through an intervening air gap. In constructing transmission channels of this sort, the entire exterior surface of the substrate may be plated and the upper exterior surfaces 706' may be etched to remove their plating. Any plating that is initially present in the base 708' between the two sidewalls may be removed, such as by etching it away. As a result, a plurality of conductively disassociated vertical plates 702' are formed. In this type of arrangement, the primary field coupling occurs between oppositely charged pairs of conductive surfaces (horizontally in FIG. 29B), and the air gaps, or spacings, are tighter between the oppositely charged pairs of conductive surfaces than is the spacing between the gaps themselves. Thus, the differential pair spacing is "electrically" tighter by way of geometric control to ensure that the primary electrical affinity remains within the differential pair.

FIG. 29C illustrates a similar structure, but one which utilizes a conductive ground plane 710' applied to the lower surface of the dielectric substrate 700'. Such structures may be used to form dense matrices of transmission channel links as is illustrated in FIG. 30 wherein a plurality of substrates 700' are stacked together on their side. Each substrate may include a ground plane 710' and three communication or signal lanes, as illustrated or other arrangements may be chosen.

Figure 31:
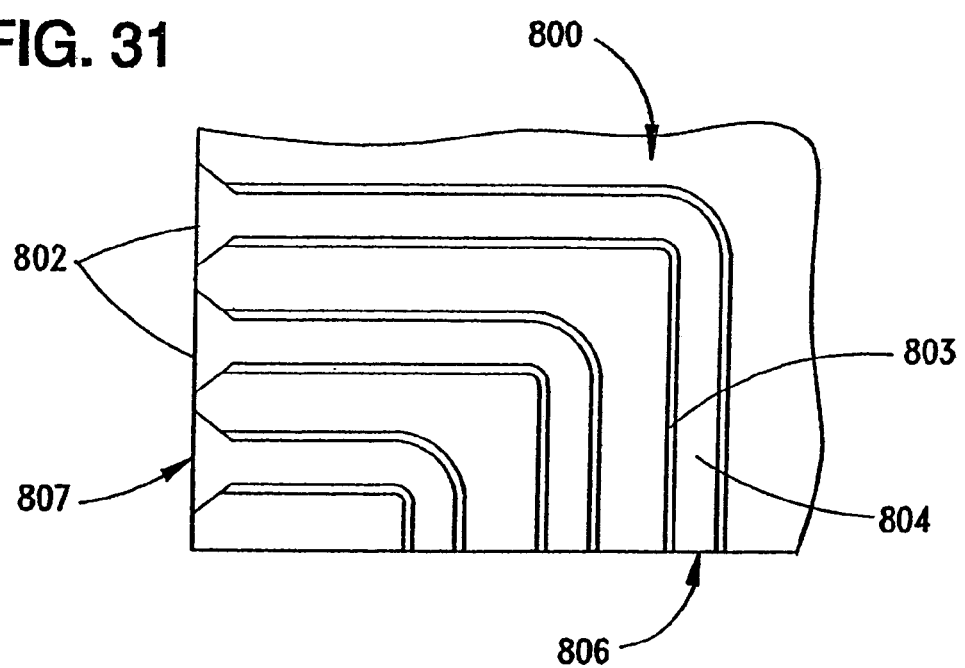
FIG. 31 is a plan view illustrating a right angle configuration of an air dielectric transmission channel similar to those of FIGS. 29A–C.

FIG. 31 illustrates the use of such a structure within a right angle context and formed in a dielectric body interior surfaces, rather then exterior surfaces. This is shown as a dielectric block 800 with a plurality of grooves, or cavities 804 formed therein. The opposite walls of the grooves 804 may be plated with conductive surfaces 803 that extend from one end 806 to a bell mouth 802 at the other end 807. The conductive surfaces 803 are spaced apart from each other and end short of the bell mouths 802 to electrically decouple the channel from the next transmission channel link section.

Figure 32:
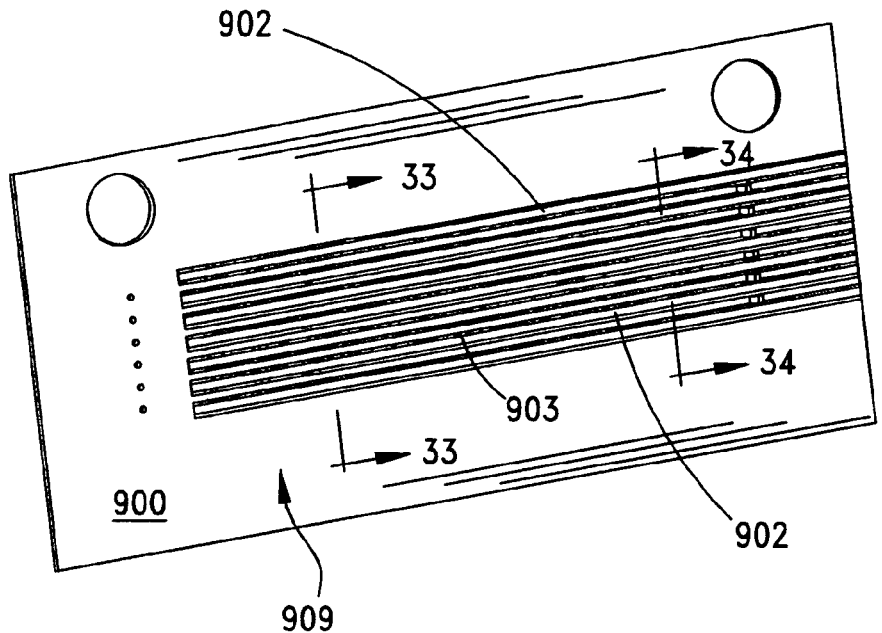
FIG. 32 is a perspective view of a waveguide assembly constructed in accordance with the principles of the present invention.
Figure 33:
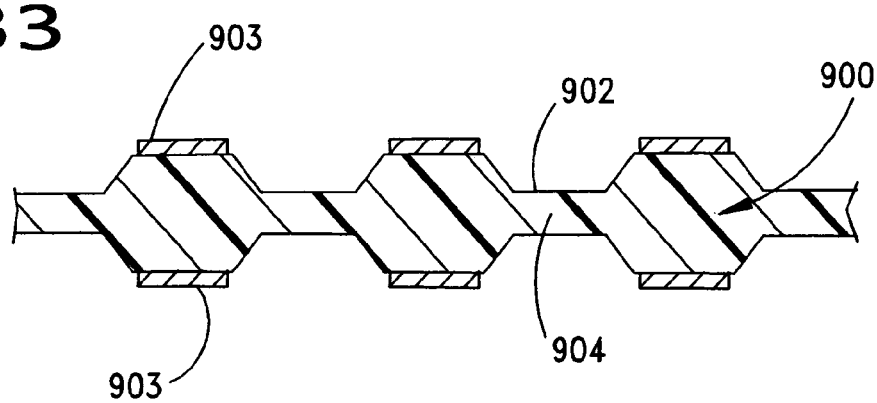
FIG. 33 is a sectional view of the waveguide assembly of FIG. 32, taken along lines 33—33 thereof.
Figure 34:
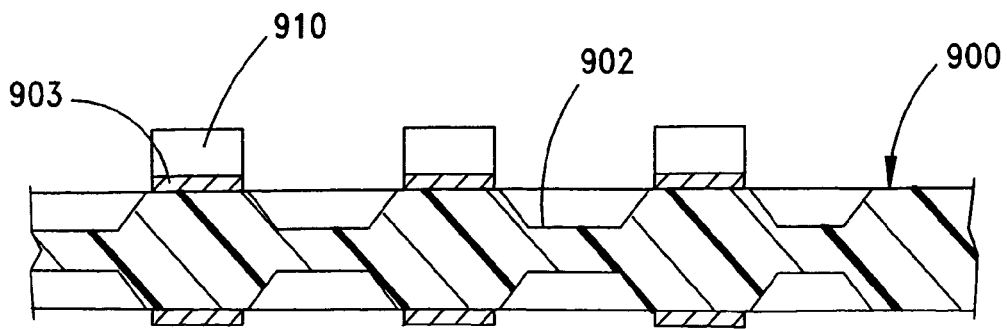
FIG. 34 is an enlarged detail view of a sectional view of the waveguide assembly of FIG. 32, taken along lines 34—34 thereof.

FIGS. 32–34 illustrate another construction of a waveguide media constructed in accordance with the principles of the present invention. As shown in FIG. 32, a dielectric substrate 900 is provided with a plurality of slots, or grooves 902, formed thereon. The slots 902 are formed in opposing surfaces of the dielectric substrate 900 and define a series of raised lands that support plated or otherwise conductive surfaces 903. The slots 902 may be considered as forming a series of thin webs 904 that reduce the cross-section of the dielectric and reduce capacitive coupling between alternate channels. The width of the conductive surface may be controlled within each signal channel or lane in order to control the impedance of the channels. As shown best in FIG. 34, surface mount members, such as feet 910 may be formed with the substrate and may include the conductive surfaces disposed on their exterior surfaces in order to establish a conductive interface for connecting with a circuit board, such as by soldering. The substrate 900 is shown formed with both the body section 900 and a surrounding base portion 909 to facilitate the molding of this body section 900. The body section 900 may be subsequently separated from its surrounding base portion by suitable trimming it therefrom.

Figure 35:
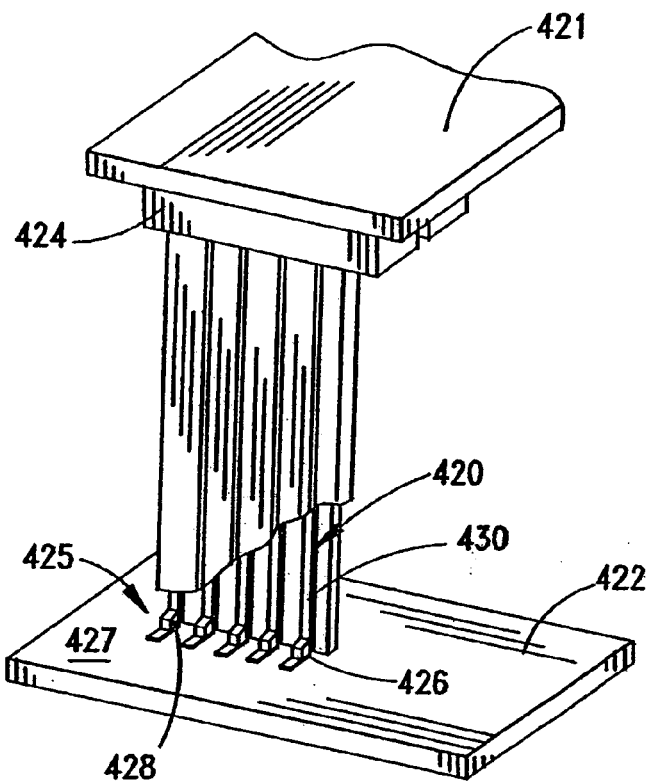
FIG. 35 is a perspective view of a connector assembly using a grouped channel transmission element of the invention extending between two circuit boards and protected by an exterior, protective jacket.

FIG. 35 illustrates a transmission line 420 (after separation from a body portion 909) of the invention that extends between two circuit boards 421, 422. The transmission line 420 mates with a connector 424, similar to the type shown in FIG. 26 and extends outwardly therefrom to a surface mount connection arrangement 425 disposed on the circuit board 422 (or formed as surface mounting "feet" that are molded or otherwise formed with the transmission line that may be attached to opposing contact pads or traces on the surface of the circuit board 422). Such a connection may include a plurality of contact members 426 that extend upwardly from the surface 427 and the contact members preferably includes conductive surfaces 428 that are arranged in opposition to the conductive strips 430 so that they will make direct contact with the strips 430 of the transmission element. They may be soldered, or otherwise attached or may rely solely upon frictional contact to make an electrical connection. The arrangement illustrated also includes an exterior protective jacket 431 formed of a plastic or metal (provided that the interior side thereof which opposes the transmission element is protected with an insulator) to protect the transmission channel from damage and exterior contact.

Figure 36:
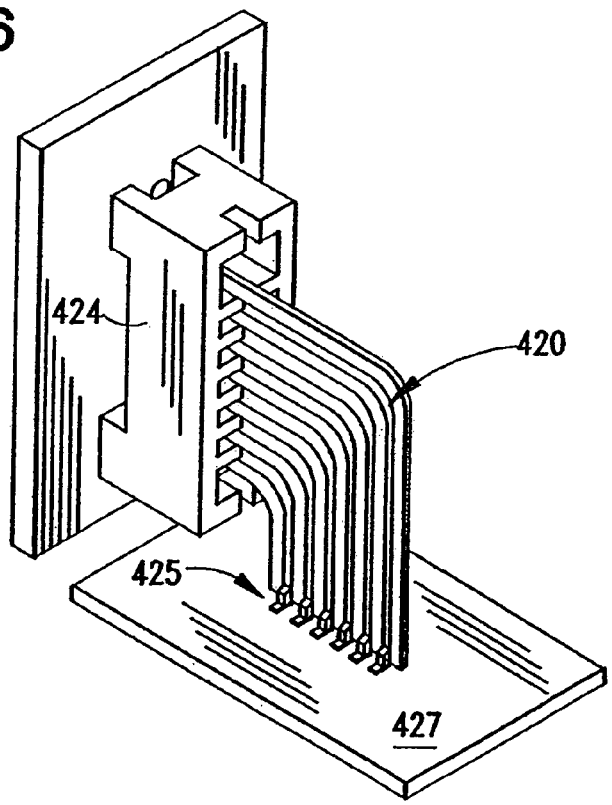
FIG. 36 is a perspective view of a variation in the use of the grouped element channel links of the invention, illustrating a right angle application thereof used to connect two circuit boards together.

In FIG. 36, the transmission link 420 is illustrated in a right-angle configuration extending between two circuit boards. The transmission link may be molded into such a shape with the desired physical dimensions of thickness, spacing, etc. so as to maintain the waveguide parameters through the turning radius. In the application shown, the transmission link interconnects a surface mount connector 424 with a circuit board 422 by way of a surface mount arrangement 425 directly positioned on the board surface 427.

Figure 37:
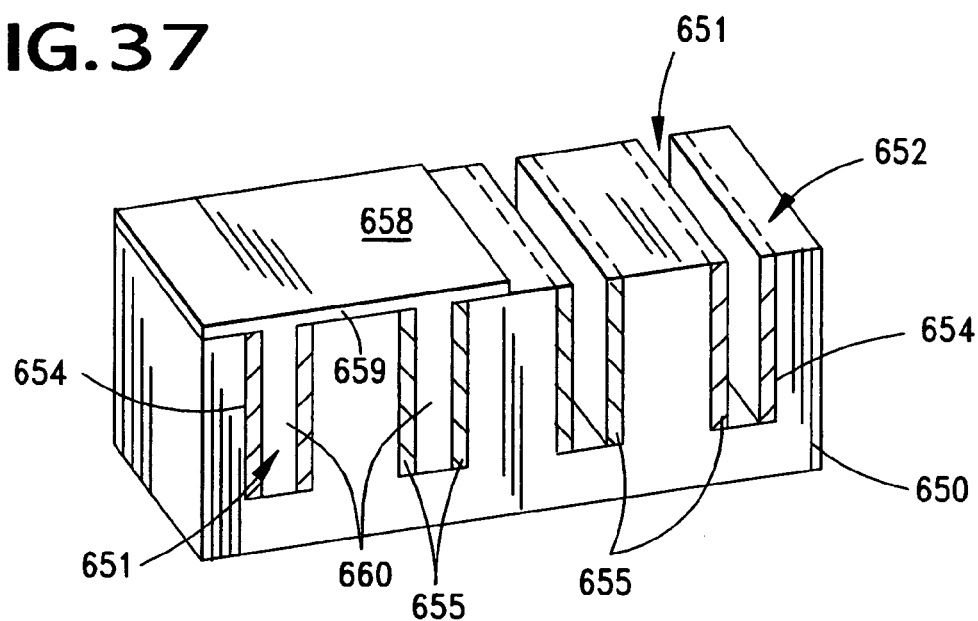
FIG. 37 is a perspective view of a high-voltage, high-density transmission line constructed in accordance with the principles of the present invention.
Figure 38:
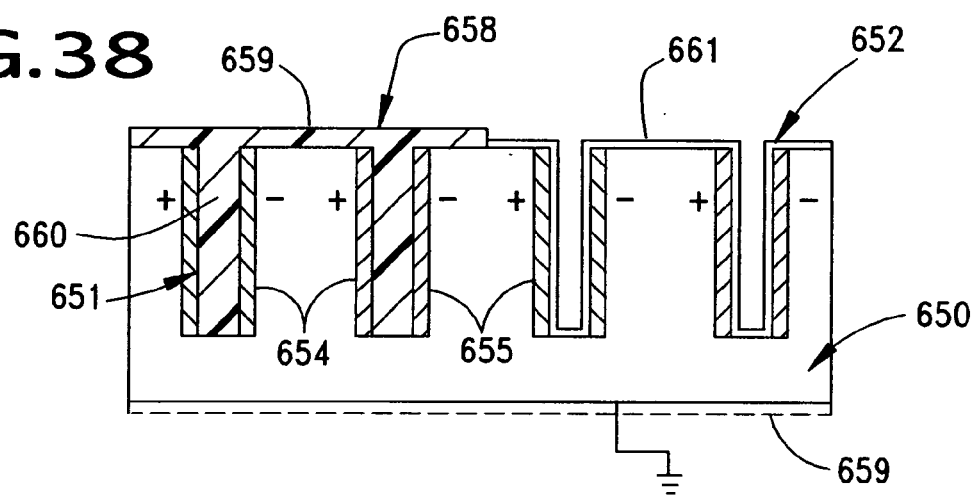
FIG. 38 is an end view of the transmission line of FIG. 37.

FIGS. 37 and 38 illustrate another embodiment of a grouped element channel transmission line, or link 650, that is particularly suitable for carrying high voltages and currents at high-density contact spacings. The body of the transmission line 650 is formed from a dielectric and it has a series of grooves, or slots 651, formed therein that extend into the body portion thereof from one surface 652 thereof. The sidewalls 654 of these slots are conductively coated with a conductive material, such as by plating, and in effect define a series of "plates" 655 that are opposed to each other and are separated by the intervening space, or air, that will typically occupy the slots 651. In the left of FIGS. 37 and 38, an insert molded plug 658 is shown and this plug includes a cap portion 659 and one or more tongues, or fillers 660 that depend from the cap portion 659 and which extend into and completely occupy the space of the slots 651. The plug 658, especially the fill portion 660 thereof extends between the opposing conductive surfaces and insulates them to prevent arcing from occurring between them. The plug is filled with a dielectric material that preferably has a high dielectric constant, one that is equal to or greater higher than the dielectric constant of the dielectric body. A ground plane 659 may be deposited on the lower surface of the transmission line of FIGS. 37 & 38 to provide increased capacitive coupling.

In this manner, and as shown best schematically in FIG. 38, the opposed polarity (i.e., "+" or "−") conductive pairs of contacts are electrically isolated from each other, but nevertheless define a complete circuit. The sizes involved with the transmission elements of the present invention permit very high densities to be achieved with a low inductance delivery mode, especially due to the large number of common parallel current paths. To the right of FIGS. 37 and 38 is shown another means for accomplishing this isolation, preferably with signal transmitting conductive surfaces, namely the use of a conformal coating 661 that conforms to the overall slot and land configuration but which provides electrical insulation or isolation between the two conductive surfaces. The spacing between the plated surfaces 654, 655 may be very small, on the order of 0.4 mm and the like and the insulative coating or film 661 prevents arcing or shorting between pairs of conductive elements. The use of opposed pairs in the transmission lines, over which is traversed current across and possibly on two opposing surfaces thereof, will lead to a lower loop inductance of the transmission line system. The conformal coating or film 661 preferably has a dielectric constant that is lower than that of the dielectric body and a dielectric constant that is close to that of air, 1.0 is most preferred.

Figure 39:
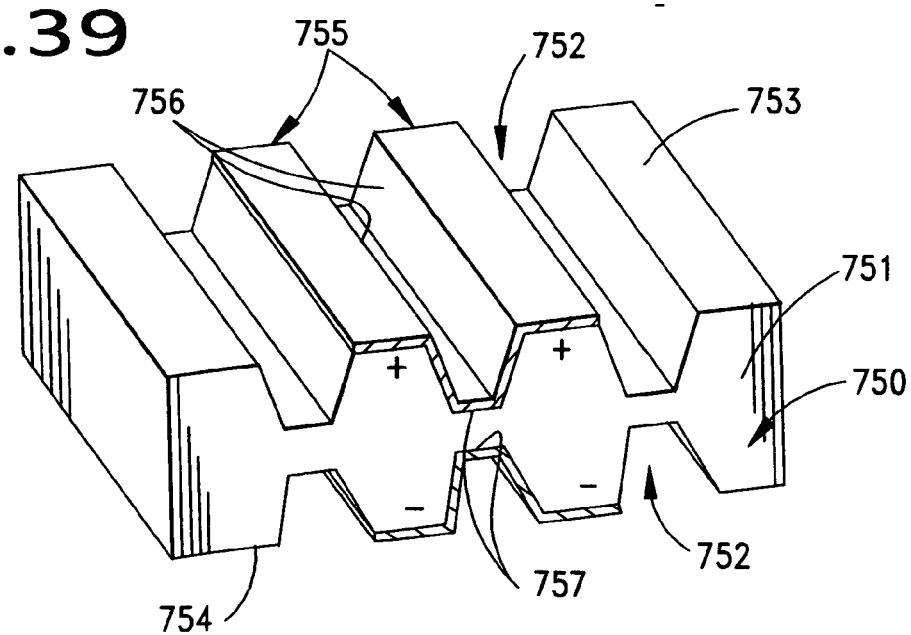
FIG. 39 is a perspective view of a transmission line of the invention that is suitable for use as a low impedance power transmission line.

As shown in FIG. 39, the transmission lines of the present invention may also be used to conduct power at very low impedance. In the transmission line 750 illustrated, a dielectric body portion 751 is provided with a series of grooves 752 formed in its outer surfaces 753. In a departure from some of the previous embodiments, more than just the exterior surfaces of the land portions of the dielectric body are plated with a conductive material. Two such lands 755 are continuously plated for the length of the transmission line 750 and they are interconnected by plating in the groove, or trough 752, that separates them, so that five distinct surfaces are plated these include the two lands 755, the two sidewalls 756 of the grooves 752 and the base 757 of the groove, which all cooperate to form a single power terminal of the transmission line. In this arrangement, there is an increased surface area which will provide an increased capacitance between the power terminal and an associated ground (or power return) terminal. The low inductance and increased capacitance will serve to lower the impedance of the overall system, so that the transmission lines of the present invention may be used for low impedance power delivery. Although shown as a hexagonal configuration, it will be understood that this arrangement would be useful in any similar configuration, such as one with raised, semi-circular lands which are interconnected by webs that form intervening valleys of different shape between adjacent lands 755.

Figure 41:
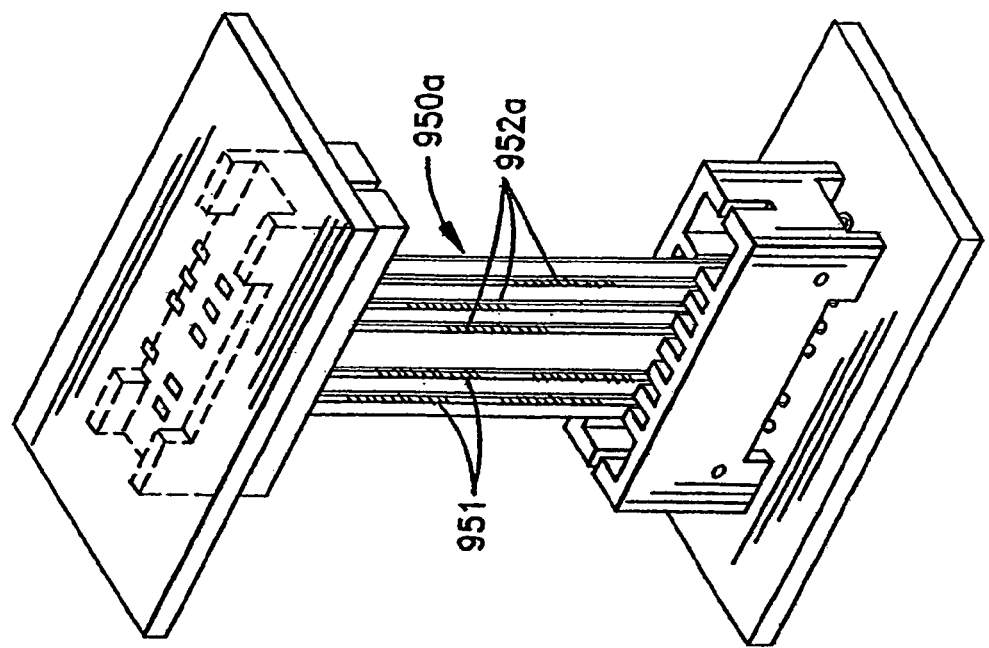
Figure 40:
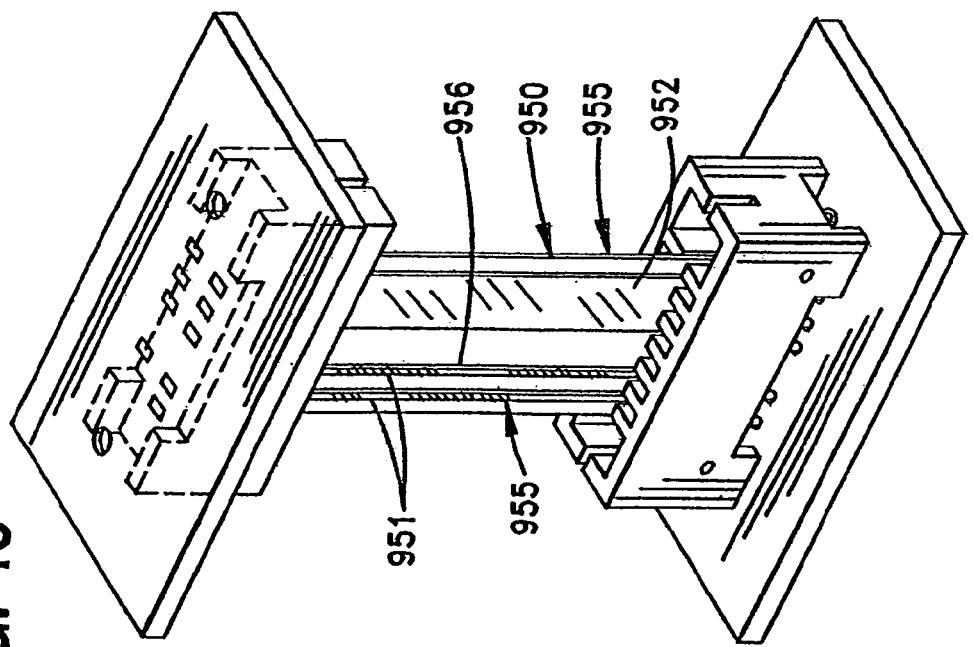
FIG. 40 is a perspective view of a mixed signal and power transmission line of the invention extending between two connectors and wherein the signal and power conductors are separated by a single isolation region; and, FIG. 41 is a perspective view if another mixed signal and power transmission line extending between two connectors and having multiple isolation regions disposed thereon to separate the signal and power conductors from each other electrically.

FIGS. 40 & 41 illustrate possible executions of the use of a mixed signal and power transmission line. In FIG. 40, it can be seen that the transmission line 950 has two signal traces, or extents 951 and a single, wide power trace, or extent 952 formed on at least one, and preferably both (opposing) surfaces 955 of the transmission line. The power extents define a large power channel with an enlarged continuous conductor for increased current handling and high capacitance with the enlarged plate areas. The power and signal regions of this type of structure may be separated by a wide "isolation" region 956 that is molded or formed as part of the transmission line. In manufacturing processes such as extrusion, the tolerances and dimensions of the isolation region may be controlled with high reliability to obtain the maximum electrical benefit and minimize cross-contamination or shorting contact between the power and signal extents.

FIG. 41 illustrates a similar structure except that the power region includes a plurality of power extents 952*a* that are separated by intervening isolation regions.

While the preferred embodiment of the invention have been shown and described, it will be apparent to those skilled in the art that changes and modifications may be made therein without departing from the spirit of the invention, the scope of which is defined by the appended claims.

What is claimed is:

1. A termination assembly for a differential signal, high-frequency transmission line, the transmission line having a dielectric body, the body including a cylindrical portion, a pair of conductive traces disposed on the exterior of the cylindrical portion, the two conductive traces being spaced apart from each a given distance along the length of and the exterior of said cylindrical portion between two opposing ends thereof, the termination assembly comprising:

a housing in the form of an end block, the end block including a body portion having a cavity disposed therein sized to receive an end of said transmission line cylindrical portion, a pair of conductive elements spaced apart from each other and disposed within the cavity so as to electrically engage said transmission line conductive traces when said transmission line cylindrical portion end is inserted into said cavity.

2. The termination assembly of claim 1, wherein said end block includes a conical end which guides said endcap into a circuit board opening.

3. The termination assembly of claim 1, further including a second housing disposed proximate to said endcap and interconnected thereto, the second endcap including a cavity for receiving a second transmission line end therein.

4. The termination assembly of claim 1, wherein said housing includes a pair of surface mount members that are formed with said housing, said surface mount members including conductive surfaces for engagement with opposing conductive surfaces of a circuit board.

5. The termination assembly of claim 1, wherein said housing includes a keyway, and said transmission line includes a key received within said keyway when said transmission line is inserted into said housing.

6. The termination assembly of claim 1, wherein said end block includes a cylindrical, hollow endcap.

7. The termination assembly of claim 1, wherein said transmission line includes a second cylindrical portion which is spaced apart from said cylindrical portion, the second cylindrical portion including a second pair of conductive traces disposed on the exterior of said second cylindrical portion, and said housing body portion includes a second cavity spaced disposed therein sized and spaced apart from said cavity, said second cavity to receive an end of said transmission line second cylindrical portion therein.

8. The termination assembly of claim 7, wherein said first and second cylindrical portions are joined together by a web portion.

9. The termination assembly of claim 1, wherein said housing includes a pair of tail portions projecting from said housing for engagement with opposing conductive surfaces of a circuit board.

10. The termination assembly of claim 9, wherein said tail portions include a pair of conductive terminals that extend into said cavity.

* * * * *